United States Patent
Okuda et al.

(10) Patent No.: US 6,677,791 B2
(45) Date of Patent: Jan. 13, 2004

(54) CLOCK GENERATION CIRCUIT, CONTROL METHOD OF CLOCK GENERATION CIRCUIT, CLOCK REPRODUCING CIRCUIT, SEMICONDUCTOR MEMORY DEVICE, AND DYNAMIC RANDOM ACCESS MEMORY

(75) Inventors: Yuichi Okuda, Higashimurayama (JP); Hideo Chigasaki, Kunitachi (JP); Hiroki Miyashita, Hachioji (JP)

(73) Assignees: Renesas Technology Corporation, Tokyo (JP); Hitachi Device Engineering Co., Ltd., Tokyo (JP)

(*) Notice: Subject to any disclaimer, the term of this patent is extended or adjusted under 35 U.S.C. 154(b) by 0 days.

(21) Appl. No.: 10/202,091

(22) Filed: Jul. 25, 2002

(65) Prior Publication Data

US 2002/0180500 A1 Dec. 5, 2002

Related U.S. Application Data

(62) Division of application No. 09/903,830, filed on Jul. 13, 2001, now Pat. No. 6,437,619.

(30) Foreign Application Priority Data

Jul. 24, 2000 (JP) .......................................... 2000-221809

(51) Int. Cl.$^7$ ............................................... H03L 7/06
(52) U.S. Cl. ........................................ 327/158; 327/156
(58) Field of Search ................................. 327/156, 158, 327/164, 165, 141, 149

(56) References Cited

U.S. PATENT DOCUMENTS

| 5,771,264 A | 6/1998 | Lane | 375/376 |
| 5,883,534 A | 3/1999 | Kondoh et al. | 327/156 |
| 6,225,840 B1 | 5/2001 | Ishimi | 327/116 |
| 6,295,245 B1 * | 9/2001 | Tomita et al. | 365/222 |
| 6,323,705 B1 * | 11/2001 | Shich et al. | 327/158 |

FOREIGN PATENT DOCUMENTS

| JP | 10-79663 | 3/1998 |
| JP | 10-126254 | 5/1998 |
| JP | 11-112308 | 4/1999 |
| JP | 11-225067 | 8/1999 |
| JP | 11-266239 | 8/1999 |

* cited by examiner

*Primary Examiner*—Dinh T. Le
(74) *Attorney, Agent, or Firm*—Antonelli, Terry, Stout & Kraus, LLP

(57) ABSTRACT

A DLL circuit or the like is configured so as to be capable of measuring the optimum number of cycles for a delay amount from the input of an external clock to the output of data through the use of a variable delay circuit and performing lock according to the measured number of cycles, whereby a clock generation circuit having a wide lock range can be implemented regardless of the performance of the variable delay circuit and a clock access time.

18 Claims, 21 Drawing Sheets

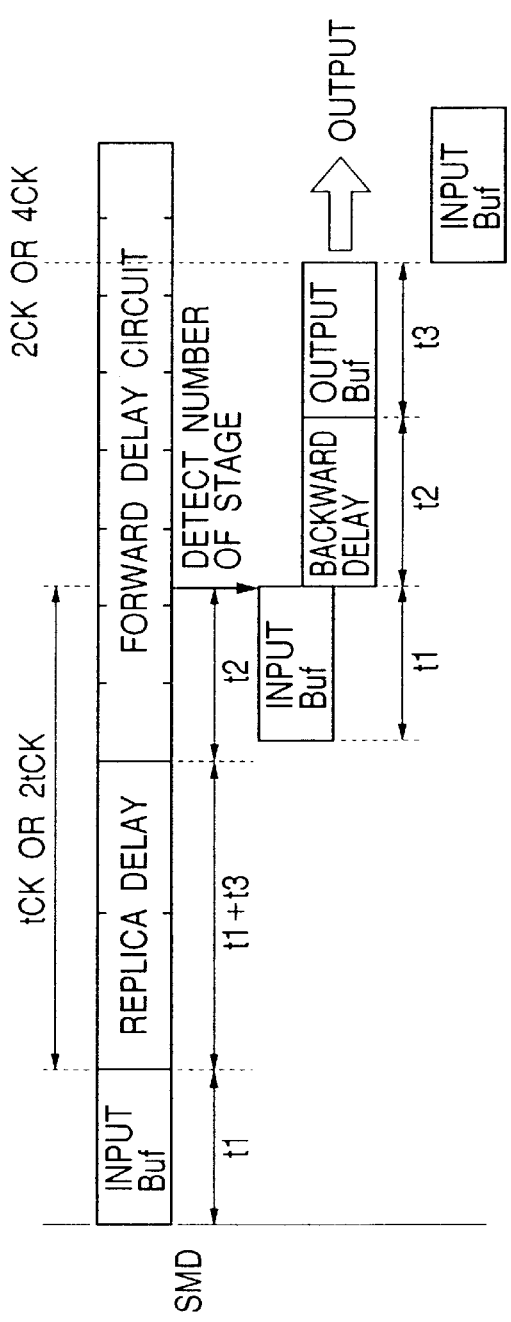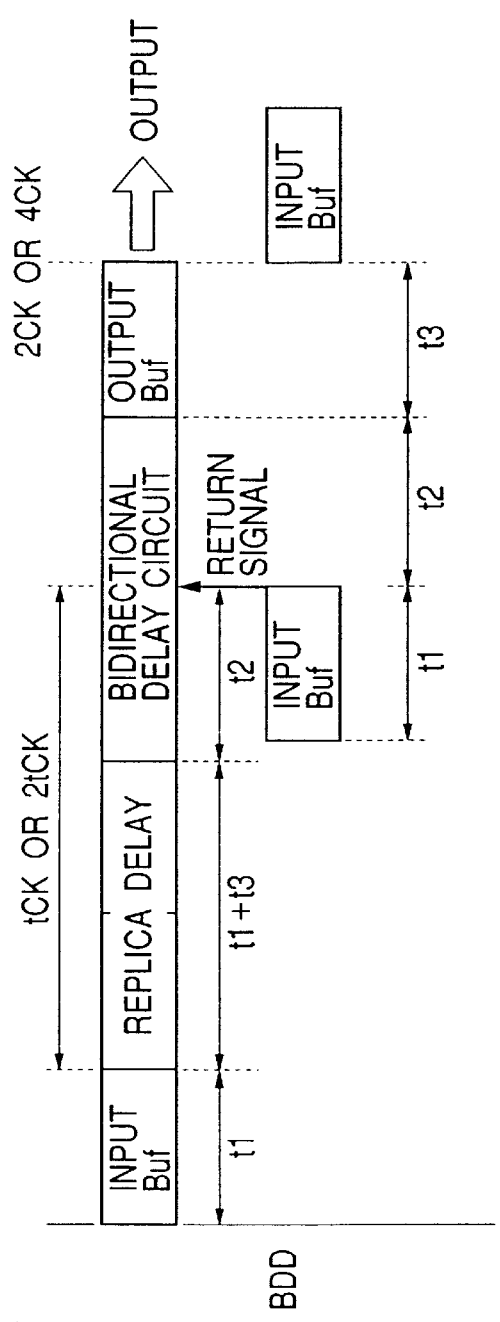
FIG. 20A
FIG. 20B

CLOCK GENERATION CIRCUIT, CONTROL METHOD OF CLOCK GENERATION CIRCUIT, CLOCK REPRODUCING CIRCUIT, SEMICONDUCTOR MEMORY DEVICE, AND DYNAMIC RANDOM ACCESS MEMORY

This is a divisional of parent application Ser. No. 09/903,830, filed Jul. 13, 2001 U.S. Pat. No. 6,437,619; the entire disclosures of which are hereby incorporated by reference.

BACKGROUND

The present invention relates to a clock generation circuit for generating internal clock signals synchronized with external clock signals, and a clock generation circuit using a DLL (Delay Locked Loop) circuit or an SMD (Synchronous Mirror Delay) circuit. The present invention also relates to a technology effective for application to a clock generation circuit for generating clock signals each used to determine output timing in an SDRAM (Synchronous Dynamic Random Access Memory), for example.

In recent years, attention has been given to a DDR (Double Date Rate) type SDRAM for performing the input/output of data at a speed twice that for each of input clocks as means for speeding up a data transfer rate of the SDRAM. It has been examined that the DDR SDRAM is equipped with a clock reproducing circuit called a "DLL (Delay Locked Loop) or SMD (Synchronous Mirror Delay)" to perform the input/output of data at high speed, thereby causing the phase of each of external clocks and that of a data output to coincide with each other. This is done to sufficiently ensure the time required to set up the output data with respect to the external clock. When the phase of the external clock and that of the data output coincide with each other, the time required between the input of a read command and the output of data might be an integral multiple of the cycle of the external clock.

In the DLL circuit or the SMD circuit, each of clocks, which is inputted from a clock input terminal and amplified to a CMOS level by an input first-stage circuit, is caused to pass through a variable delay circuit to thereby generate an internal clock having a desired phase. The internal clock drives a data output latch and the latched data is outputted to the outside through an output buffer. The phase of the internal clock is set so that the phase of the output data coincides with or corresponds to that of the external clock. A type for controlling a delay amount of the variable delay circuit, which is used to determine the phase of the internal clock, by a feedback loop is called "DLL", whereas a type for determining a delay amount by a delay amount measuring circuit is called "SMD".

Unexamined Patent Publication Nos. Hei 11(1999)-225067 and Hei 10(1998)-126254 respectively disclose a semiconductor device including a clock reproducing circuit which has the function of delaying each of external clocks according to its cycle while automatically switching or selecting the number of clock cycles from the external clock to an internal clock according to a clock cycle time to generate the internal clock, thereby making it possible to reduce a circuit scale and stop its operation at standby, reducing an error relative to the external clock, and providing a wide operating frequency range and a frequency doubling function. Unexamined Patent Publication No. Hei 10(1998)-79663 discloses an internal clock signal generation circuit for generating an internal signal phase-synchronized with an external signal through the use of voltage-controlled delay elements, wherein offsets are selectively given to delay times through the voltage-controlled delay elements, whereby it can reliably be locked over a wide frequency domain. Unexamined Patent Publication No. Hei 11(1999)-266239 discloses a clock synchronous delay control circuit which allows delay amounts of delay lines at respective portions of the circuit to be switched over, thereby making it possible to expand an operating frequency band. Unexamined Patent Publication No. Hei 11(1999)-112308 discloses a synchronous delay circuit device which controls the entire delay time of a delay circuit sequence or array according to the results of device states by the measurement of the frequency of an external clock, the measurement of a source voltage to be used, the measurement of device variations in chip, etc., thereby preventing running-off of the clock or its edge from a first-stage delay circuit sequence or array even when used at a low frequency, whereby it properly operates and ensures a suitable delay time, and is configured in a small scale as a result thereof.

SUMMARY OF THE INVENTION

It is expected that the above-described SDRAM will be required of a further speeding-up from now on with the speeding-up of a CPU. However, the more the SDRAAM is speeded up, the more power consumption increases. When the form of usage of the SDRAM is taken into consideration, it is also necessary to operate the SDRAM at high speed when the CPU is performing computations or the like. However, when the CPU does not perform the computations, it is not necessary to operate the SDRAM at high speed. Further, the cycle of a clock is extended to operate the SDRAM at low speed, thereby making it possible to restrain or control power consumption.

In the conventional SDRAM using the DLL or SMD, however, the number of delay clock cycles from the input of the read command to the output of the data was kept constant. A frequency range (clock cycle range: hereinafter called a "lock range") of an external clock, in which the DLL or SMD is capable of outputting each clock having a desired phase, was determined according to the performance of a variable delay circuit and a phase difference (hereinafter called a "clock access time") between the external clock corrected by a clock generation circuit and output data.

Assuming that, for example, the minimum delay amount of the variable delay circuit is defined as tdmin, the maximum delay amount thereof is defined as tdmax, the clock access time is defined as tca, and the number of delay cycles from the input of the read command to the output of the data is defined as n, respectively, the minimum period or cycle of the external clock and the maximum period or cycle thereof are given as follows:

Minimum cycle of external clock=(tdmin+tca)/n

Maximum cycle of external clock=(tdmax+tca)/n

As evident as viewed from the above equations, when the performance of the variable delay circuit, i.e., tdmin and tdmax are assumed to be constant, the maximum cycle of the external clock will decrease when an attempt is made to increase n for the purpose of speeding up the SDRAM and thereby reduce the minimum cycle of the external clock. When an attempt is made to reduce n for the purpose of decreasing the speed thereof and thereby increase the maximum cycle, the minimum cycle of the external clock will increase. Thus, a delay variable range of the variable delay circuit must be increased to make it possible to lower the allowable minimum cycle of the external clock and increase the allowable maximum cycle of the external clock.

However, a problem arises in that when an attempt is made to do so in the conventional circuit format or type as it is, the number of stages for delay gates must be increased, so that the variable delay circuit increases in circuit scale, thereby resulting in an increase in its occupied area and an increase in power consumption.

An object of the present invention is to provide a clock generation circuit relatively small in circuit scale and having a wide lock range. The above, other objects and novel features of the present invention will become apparent from the description of the present invention and the accompanying drawings.

Summaries of typical ones of the inventions disclosed in the present application will be explained in brief as follows:

A variable delay circuit is used in the case of DLL, and a delay amount measuring circuit is used in the case of SMD. In a start sequence specified by an MRS (Mode Register Set) command or the like, the corresponding circuit is configured so as to be capable of measuring the optimum number of cycles for a delay amount from the input of an external clock to the output of data and performing lock according to the measured number of cycles, whereby a clock generation circuit having a wide lock range can be implemented regardless of the performance of the variable delay circuit and a clock access time.

More specifically, in a clock generation circuit comprising at least one input terminal, at least one output terminal, fixed delay applying means which applies a predetermined delay corresponding to a time from the time at which a signal is inputted to the input terminal, to the output of a signal from the output terminal, a variable delay circuit comprising a combination of one or more variable delay elements each having a delay time control terminal, a phase detector which detects a phase difference between a signal prior to being inputted to the variable delay circuit and a signal delayed by the variable delay circuit and the fixed delay applying means, delay amount control means which controls a delay amount developed in the variable delay circuit according to the phase difference detected by the phase detector, and number-of-cycles control means which determines the number of clock cycles for a delay from the input of the signal to the variable delay circuit to the execution of the phase comparison by the phase detector, the delay amount control means controls the delay amount of the variable delay circuit according to the number of clock cycles determined by the number-of-cycles control means.

Alternatively, in a clock generation circuit comprising at least one input terminal, at least one output terminal, fixed delay applying means which applies a predetermined delay corresponding to a time from the time at which a signal is inputted to the input terminal, to the output of a signal from the output terminal, a variable delay circuit comprising a combination of one or more variable delay elements each having a delay time control terminal, a phase detector which detects a phase difference between a signal prior to being inputted to the variable delay circuit and a signal delayed by the variable delay circuit and the fixed delay applying means, delay amount control means which controls a delay amount developed in the variable delay circuit according to the phase difference detected by the phase detector, and number-of-cycles control means which determines the number of clock cycles for a delay from the input of the signal to the variable delay circuit to the execution of the phase comparison by the phase detector, the number-of-cycles control means inputs an external clock signal or a test signal synchronized with the external clock signal and having a predetermined delay to the variable delay circuit, and observes a signal obtained from a predetermined delay stage of the variable delay circuit to thereby determine the optimum number of clock cycles, and thereafter the delay amount control means controls the delay amount of the variable delay circuit according to the number of clock cycles determined by the number-of-cycles control means.

According to the above means, the number of the clock cycles is reduced when the cycle of each clock is long, whereas the number of the clock cycles increases when the cycle thereof is long. Thus, a clock generation circuit having a wide lock range can be implemented using a variable delay circuit relatively narrow in delay amount variable range as compared with the case where the number of the clock cycles is fixed.

The fixed delay applying means provides a fixed delay corresponding to the sum of a delay developed in a signal path from the input terminal to the variable delay circuit and a delay developed in a signal path from the variable delay circuit to the data output terminal, for a signal inputted thereto. Thus, an output clock synchronized with each clock signal inputted from the outside can be produced.

The variable delay circuit comprises a plurality of variable delay elements connected in series. In the variable delay circuit, the number of stages for the variable delay elements through which the input signal passes up to the output thereof, is controlled to vary the delay amount of the variable delay circuit. Owing to the series-connection of the plurality of variable delay elements, control on a delay amount by the selection of the number of stages for the delay elements can be performed in addition to control on a delay amount developed in one variable delay element. Therefore, a delay amount variable range of the variable delay circuit becomes wide.

Further, there is provided number-of-cycles control means which controls the number of clock cycles for a delay amount from the input of the variable delay circuit to the output of the fixed delay circuit, based on a signal outputted from the variable delay circuit. It is therefore possible to automatically detect the optimum number of clock cycles and control a delay amount based on it.

Furthermore, there is provided means which generates a signal or voltage for controlling the delay amount of the variable delay circuit according to the phase difference detected by the phase detector. It is thus possible to perform an automatic phase coincidence or adjustment based on a feedback loop.

Still further, there is provided a first divider provided in a stage preceding the phase detector, which divides a signal prior to being inputted to the variable delay circuit. The first divider is configured so as to output signals different in phase by a clock cycle, according to the number of the clock cycles determined by the number-of-cycles determining means. It is thus possible to avoid lapsing into a harmonic lock state due to a phase comparison between improper signal edges.

The delay amount control means includes filter capacitors each of which generates a voltage corresponding to the phase difference detected by the phase detector. The filter capacitors may preferably have capacitance values varied according to the number of stages for the variable delay elements through which the signal inputted to the variable delay circuit passes up to the output thereof. It is thus possible to avoid the rate of control on a delay amount to the voltage corresponding to the phase difference from varying due to the difference in the number of delay stages activated in the variable delay circuit, and make rapid transition to a phase-locked state.

Further, in a semiconductor memory device provided with such a clock generation circuit as described above, a clock signal supplied from the outside is inputted to the clock generation circuit to generate a clock signal, and data is outputted with the generated clock signal as a timing signal, whereby a semiconductor memory device can be implemented which is short in clock access time and long in setup time.

BRIEF DESCRIPTION OF THE DRAWINGS

FIGS. 20A and 20B are respectively timing charts showing operations of the SMD circuit and the BDD circuit;

DETAILED DESCRIPTION

Figure 1:
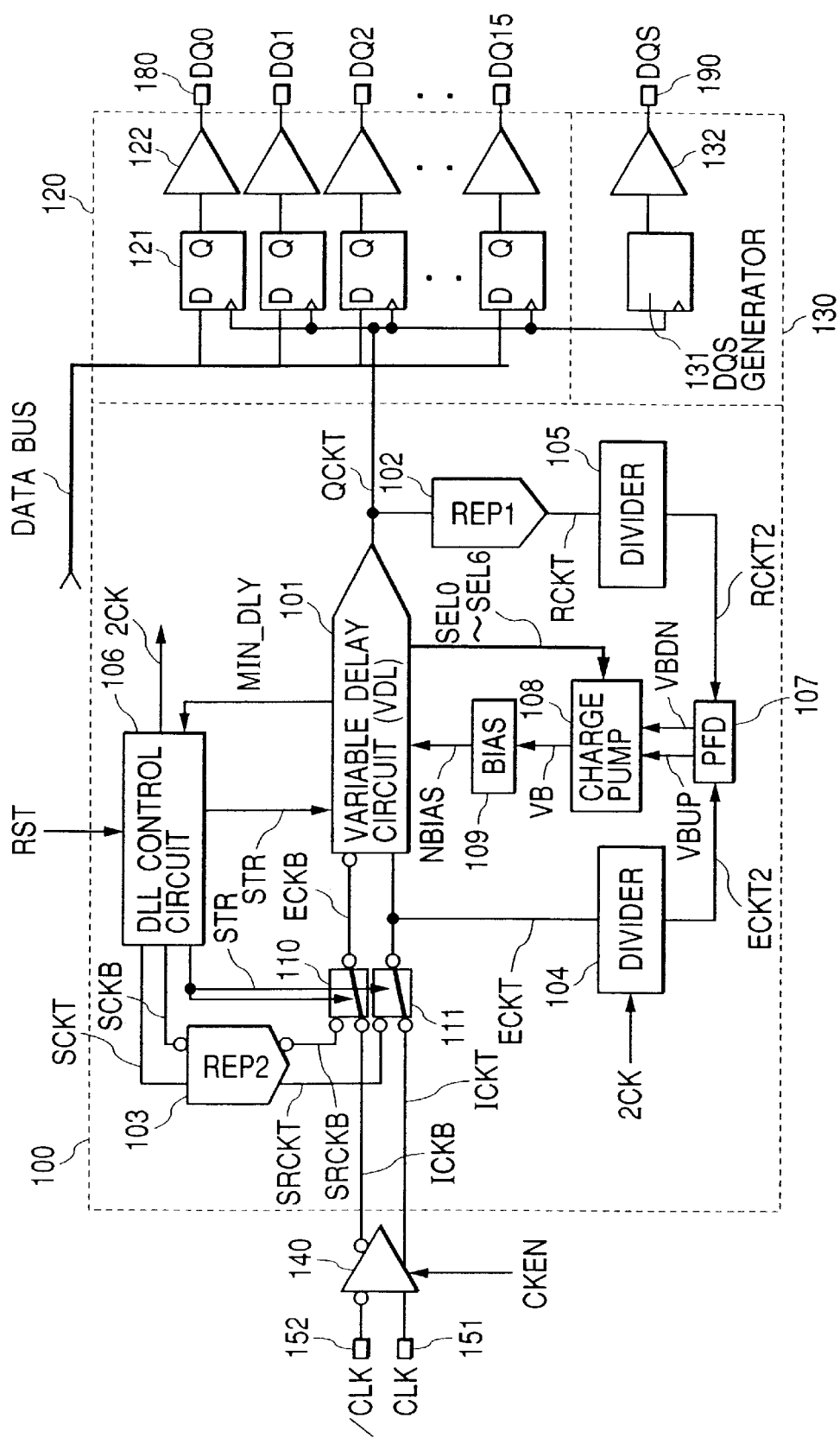
FIG. 1 is a block diagram showing a schematic configuration of a first embodiment of a DLL circuit to which the present invention is applied.

FIG. 1 shows a first embodiment of a clock generation circuit using DLL (Delay Locked Loop) of a DDR SDRAM, to which the present invention is applied.

A rough configuration will first be described. Reference numeral 100 indicates a clock generation circuit, reference numeral 120 indicates an output circuit capable of outputting, for example, 16-bit data DQ0 through DQ15 in parallel, reference numeral 130 indicates a circuit for outputting a data strobe signal DQS for giving timings provided to capture data DQ0 through DQ15 with the same cycles and phases as those of the data DQ0 through DQ15, reference numeral 140 indicates an input buffer circuit which inputs external clocks CLK and /CLK, reference numeral 151 indicates a terminal for inputting the external clock CLK, reference numeral 152 indicates a terminal for inputting an antiphase clock /CLK, reference numerals 180 indicate terminals for outputting the data DQ0 through DQ15, and reference numeral 190 indicates a terminal for outputting the data strobe signal DQS, respectively. The output circuit 120 comprises data latch circuits 121 and output buffer circuits 122 respectively provided in association with respective bits for the output data DQ0 through DQ15.

The clock generation circuit 100 comprises a variable delay circuit (VDL) 101 for delaying input external clocks CLK and /CLK, a replica delay circuit (REP1) 102, which has a delay amount equivalent to the sum (t1+t3) of a delay amount t1 of the input buffer 140 and a delay amount t3 of each data latch circuit 121 and each output buffer circuit 122 and delays the output of the variable delay circuit 101, a divide-by-4 circuit or divider 104 for dividing-by-four an external clock ECKT brought from the input buffer 140, a divide-by-4 circuit or divider 105 for dividing-by-four an output ECKT of the replica delay circuit 102, a DLL control circuit 106 for controlling the operations of the variable delay circuit 101 and the divide-by-4 circuit 104, a phase frequency comparator or detector (PFD) 107 for comparing the phases of clocks ECKT2 and RCKT2 divided by the divide-by-4 circuits 104 and 105 to thereby detect a phase different therebetween, a charge pump 108 for generating a voltage VB corresponding to the phase difference, based on outputs VBUP and VBDN produced from the phase frequency detector 107, a bias circuit 109 for generating a delay amount control signal NBIAS with respect to the variable delay circuit 101, based on the generated voltage VB, etc.

Further, the clock generation circuit 100 employed in the present embodiment is provided with a second replica delay circuit (REP2) 103 which has a configuration similar to the replica delay circuit 102 and delays a signal supplied from the variable delay circuit 101, and selector switches 110 and 111 for selecting either of external clocks ICKT and ICKB captured from the input buffer 140 or signals SRCKT and SRCKB delayed by the second replica delay circuit 103 and supplying it to the variable delay circuit 101. Each of the selector switches 110 and 111 performs switching control according to a control signal STR supplied from the DLL control circuit 106.

The present embodiment is characterized in that the DLL control circuit 106, the second replica delay circuit 103 and the variable delay circuit 101 measure the optimum number of stages of the variable delay circuit 101 and the optimum number of cycles n corresponding to a delay amount from the input of each external clock to the output of data. The present embodiment is intended to determine the number of operational stages of the variable delay circuit according to the result of measurements, and control whether either of two divided clocks shifted one cycle in rising edge from each other should be outputted from the divide-by-4 circuit or divider 104 in response to a control signal 2CK based on the result of measurement of the number of cycles n to thereby obtain a wide lock range. The DLL control circuit 106 is a circuit for generating signals for controlling the entire DLL. While various control signals as well as the control signals STR and 2CK are generated from the DLL control circuit 106, only the signals related to the contents of the present invention are shown in FIG. 1.

The function and operation of the clock generation circuit 100 according to the present embodiment will next be described.

As described above, the clock generation circuit 100 employed in the DDR SDRAM is a circuit for adjusting or controlling the phase of an internal clock QCKT so that the phases of the data outputs DQ0 through DQ15 and the phases of the input clocks CLK and /CLK are associated with one another (or coincide with one another). Let's assume that to understand a phase control operation, the selector switches 110 and 111 are respectively kept in states in which they supply the external clocks ICKT and ICKB brought from the input buffer 140 to the variable delay circuit 101.

Let's now assume that the delay amount of the clock input buffer 140 is given as t1, the delay amount of the variable delay circuit 101 is given as t2 (variable), the sum of the delay amounts of the data output latch 121 and the data output buffer 122 is given as t3, and each of the delay amounts of the divide-by-4 circuit 104 and the divide-by-4 circuit 105 is given as tDIV, respectively. The replica delay circuit 102 has a delay amount (t1+t3) substantially equal to a clock access time to provide a desired phase for the clock QCKT delayed by the variable delay circuit 101. The phase frequency detector 107 outputs VPUP and VPDN signals so as to cause the phases of the clocks ECKT2 and RCKT2 divided by the divide-by-4 circuits 104 and 105 to coincide with each other to thereby control the value of the delay amount t2 of the variable delay circuit 101.

Thus, assuming that the cycles of the external clocks CLK and /CLK are respectively defined as tCK in the clock generation circuit 100, the delay of the clock QCKT on the output side of the variable delay circuit 101 with respect to the clocks CLK and /CLK is given as the sum of the delay amount t1 of the input buffer 140 and the delay amount t2 of the variable delay circuit 101 as follows:

$$t1+t2$$

Therefore, the delay of the clock RCKT2 on the output side of the divide-by-4 circuit 105 is given as follows:

$$t1+t2+tDIV+(t1+t3)$$

On the other hand, the delay of the clock ECKT2 on the output side of the divide-by-4 circuit 104 is given as follows:

$$t1+tDIV$$

Since the phase of RCTT2 and the phase of ECKT2 are controlled equally, the following equation is established assuming now that the coincidence or matching between the phase of RCKT2 and the phase of ECKT2 is made in a 1 clock cycle:

$$t1+t2+tDIV+(t1+t3)=t1+tDIV+tCK \quad \text{(Equation 1)}$$

This equation is arranged as follows:

$$t2=tCK-(t1+t3)$$

$$t2+t2+t3=tCK$$

Figure 2A:
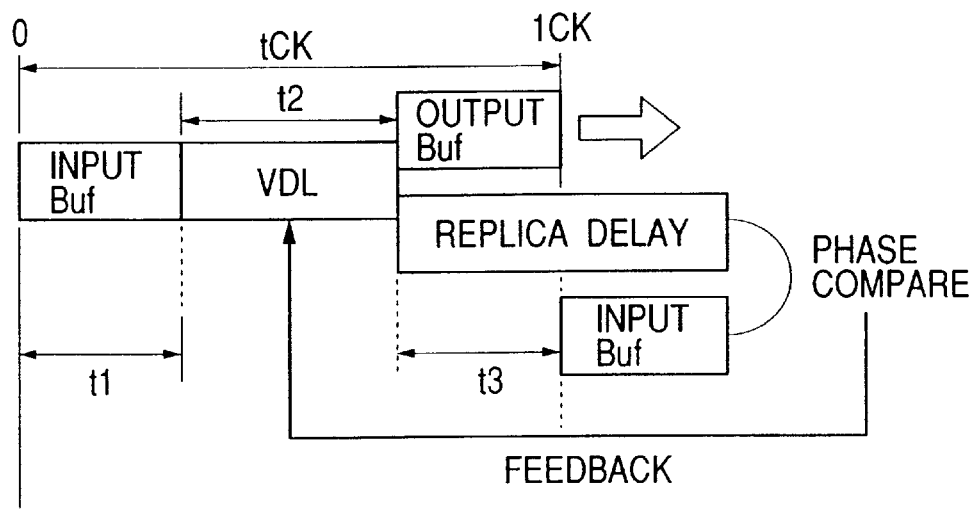
FIGS. 2A and 2B are respectively explanatory diagrams showing the relationship between the cycle of an external clock and an internal delay in a 1CK lock state and a 2CK lock state in the DLL circuit according to the first embodiment.

This will be explained with reference to the drawings. As show in FIG. 2A, it means that the delay amount t2 of the variable delay circuit 101 is controlled so that the sum (t1+t2+t3) of the delay amount t1 of the input buffer 140, the delay amount t2 of the variable delay circuit 101 and the delay amount t3 of the output latch 121 and the data output buffer 122 coincides with the cycle tCK of each of the external clocks CLK and /CLK.

On the other hand, the above-description shows where the phase matching is carried out in the 1 clock cycle. Assuming that the delay amount t2 of the clock generation circuit 100 shown in FIG. 1, theoretically, i.e., the variable delay circuit 101 can be controlled to 0 to infinity, the phase locking or matching may be performed in n clock cycle (where n: whole number) without being done in the 1 clock cycle. This can be represented by the following equation:

$$t1+t2+tDIV+(t1+t3)=t1+tDIV+n\times tCK$$

This equation is arranged as follows:

$$t2=n\times tCK-(t1+t3)$$

Thus, the delay of QCKT is represented as follows:

$$N\times tCK-t3$$

Since the delays of the output data DQ0 through DQ15 correspond to the sum of the delay (n×tCK−t3) and the delay amount t3 of the output latch 121 and the data output buffer 122, the delays thereof result in n×tCK. Thus, the phases of the output data DQ0 through DQ15 become equal to the phase of each of the input clocks CLK and /CLK. From this point of view, it is understood that the total value of the delay amount t2 of the variable delay circuit 101 and a clock access time (t1+t3) results in n×tCK. Namely, the total value is represented as follows:

$$t2+(t1+t3)=n\times tCK \quad \text{(Equation 2)}$$

where the value of n is an integer. With the use of the value of the number of cycles n, it will be called "nCK lock" as in the case of 1CK lock, and 2CK lock, for example.

Figure 2B:
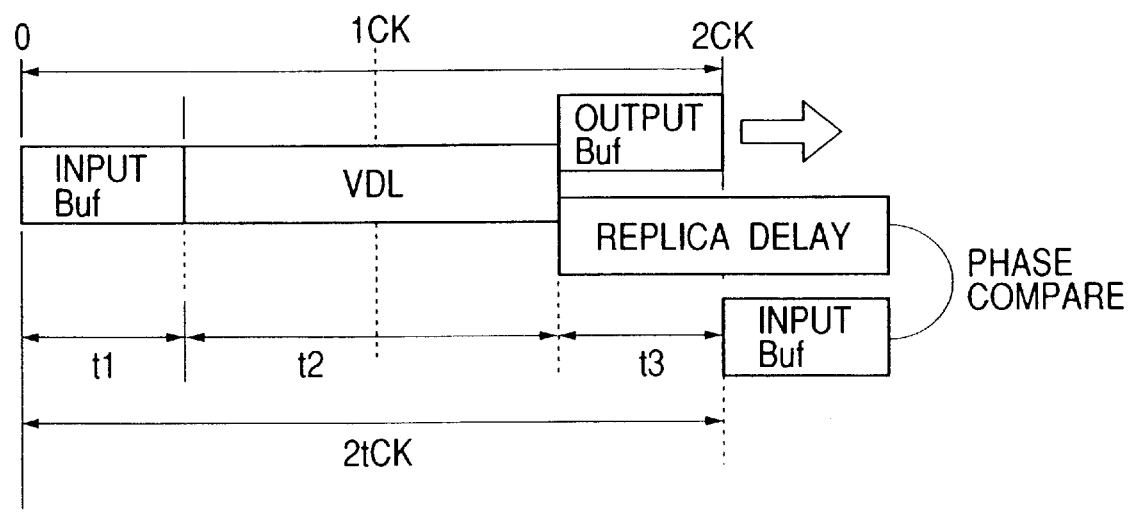

FIG. 2B shows the relationship between the sum (t1+t2+t3) of a delay amount t1 of the input buffer 140, a delay amount t2 of the variable delay circuit 101 and a delay amount t3 of the output latch 121 and the data output buffer 122, and a clock cycle tCK in the case of 2CK lock in which the circuit is phase-locked in 2 clock cycles. In the case of the 2CK lock, the delay amount t2 of the variable delay circuit 101 is controlled so as to meet the relationship of (t1+t2+t3)=2tCK as shown in FIG. 2B. In the case of 3CK lock, the delay amount t2 of the variable delay circuit 101 is controlled so as to meet the relationship of (t1+t2+t3)=3tCK.

Further, in the present embodiment, the divide-by-4 circuits 104 and 105 are provided in stages preceding the phase frequency detector 107 so as to compare the phases of the clocks obtained by dividing ECKT and RCKT. This is done to prevent a malfunction developed due to harmonic lock.

The harmonic lock and countermeasures thereagainst will be described with reference to FIG. 3. Since the delay amount of the variable delay circuit 101 is minimum, t2+(t1+t3) is also regarded as the minimum.

When external clocks CLK and /CLK are inputted, a rising edge E_0 of a clock ECKT corresponding to the external clocks propagates through the variable delay circuit 101 and the replica delay circuit 102 so as to reach a rising edge $R_{13}0$ of a clock RCKT. A delay amount from the rising edges E_0 to R_0 becomes t2+(t1+t3). Similarly, rising edges E_2, E_3, . . . result in R_2, R_3, . . . Let's now consider where a cycle tCK of the external clocks CLK and /CLK is large and t2+(t1+t3) <tCK/2 as shown in FIGS. 3(a) and 3(b). The rising edge of the clock ECKT, which is nearest to the rising edge R_0 of the clock RCKT in phase, is E_0. Thus, when the clocks ECKT and RCKT are directly inputted to the phase frequency detector 107 to perform phase control, a delay amount t2 of the variable delay circuit 101 is controlled in the direction to reduce it to cause the phase of R_0 to coincide with that of E_0. Since, however, the delay amount t2 of the variable delay circuit 101 is already minimum at this time, it is not possible to cause the rising edge of the clock RCKT to coincide with the rising edge of the clock ECKT. This state is called a malfunction developed due to harmonic lock.

To prevent the malfunction developed due to the harmonic lock, the DLL shown in FIG. 1 is provided with the divide-by-4 circuits 104 and 105. Therefore, a clock RCKT2 outputted from the divide-by-4 circuit 105 waits for such a phase as shown in FIG. 3(e). Namely, the divide-by-4 circuit 105 generates a rising edge R2_0 of RCKT2 from the rising edge R_0 of the clock RCKT. When n =1, a clock ECKT2 outputted from the divide-by-4 circuit 104 waits for such a phase as shown in FIG. 3(c). Namely, the divide-by-4 circuit 104 generates a rising edge $E_{13}21$ of ECKT2 from the rising edge E_1 of the clock ECKT. When n=2, a clock ECKT outputted from the divide-by-4 circuit 104 has such a phase as shown in FIG. 3(d). Namely, the divide-by-4 circuit 104 generates a rising edge E2_2 of ECKT2 from the rising edge E_2 of the clock ECKT.

Here, a delay amount from R_0 to R2_0, a delay amount from E_1 to E2_1, and a delay amount from E2 to E2_2 are respectively equal to tDIV. The phases of the clocks ECKT2 shown in FIGS. 3(c) and 3(d) are shifted by one clock cycle tCK. Whether either the clock shown in FIG. 3(c) or the clock shown in FIG. 3(d) should be outputted from the divide-by-4 circuit 104, is determined according to a control signal 2CK supplied from the DLL control circuit 106, based on the required value of n.

When n=1, the phase of the clock ECKT2 is represented as shown in FIG. 3(c). When the clocks ECKT2 and RCKT2 are inputted to the phase frequency detector 107 to perform a phase comparison therebetween, the rising edge of ECKT2 nearest to the rising edge R2_0 of RCKT2 results in E2_1. Thus, at this time, the phase frequency detector 107 outputs a down signal VBDN so as to cause the rising edge R2_0 of RCKT2 to coincide with the rising edge E2_1 of ECKT2. Since this is kept in the direction to increase the delay time t2 of the variable delay circuit 101, it is possible to prevent a malfunction developed due to harmonic lock.

On the other hand, when n=2, the phase of the clock ECKT2 is represented as shown in FIG. 3(d). When the clocks ECKT2 and RCKT2 are inputted to the phase frequency detector 107 to perform a phase comparison therebetween, the rising edge of ECKT2 nearest to the rising edge R2_0 of RCKT2 results in E2_2. Thus, at this time, the phase frequency detector 107 outputs a down signal VBDN so as to cause the rising edge R2_0 of RCKT2 to coincide with the rising edge E2_2 of ECKT2. Since this is kept in the direction to increase the delay time t2 of the variable delay circuit 101, it is possible to prevent a malfunction developed due to harmonic lock.

While a description has been made of where n=1 and n=2, the present embodiment can cope even with n=3 and n=4 according to a system similar to the above. However, the divide-by-4 circuits may be used where n=1 or n=2 but divide-by-2n circuits are necessary as in the case of divide-by-6 circuits where n=3, divide-by-8 circuits where n=4, . . . Thus, the control on the number of the clock cycles is not limited to switching between the 1CL clock and the 2CK clock. The control on the number of the clock cycles is capable of coping with switching between the 1CK clock and 3CK clock, switching between the 2CK clock and 3CK clock, etc.

Meanwhile, the present invention is aimed to provide a DLL wide in lock range. Incidentally, the lock range described in the present specification indicates a frequency range in which the DLL can output a clock QCKT for data latch in a desired phase, or a range of the clock cycle tCK. The cycle at the maximum frequency, of an outputtable clock will be defined as tCKmin, and the cycle thereof at the minimum frequency will be defined as tCKmax.

Needless to say, a delay amount control range (delay amount variable range) exists in the variable delay circuit 101. Assuming now that the maximum delay amount of the variable delay circuit 101 is given as t2max and the minimum delay amount thereof is given as t2min, the lock range is determined in the following manner from the Equation (2).

$$tCKmin=(t2min+(t1+t3))/n \qquad \text{(Equation 3)}$$

$$tCKmax=(t2max+(t1+t3))/n \qquad \text{(Equation 4)}$$

As can be seen from the Equations (3) and (4), when n is kept constant, the lock range would be determined by the delay amount control range of the variable delay circuit 101 and the clock access time (t1+t3). Thus, in the present invention, n is varied as described above to provide a DLL having a wide lock range.

Figure 4:
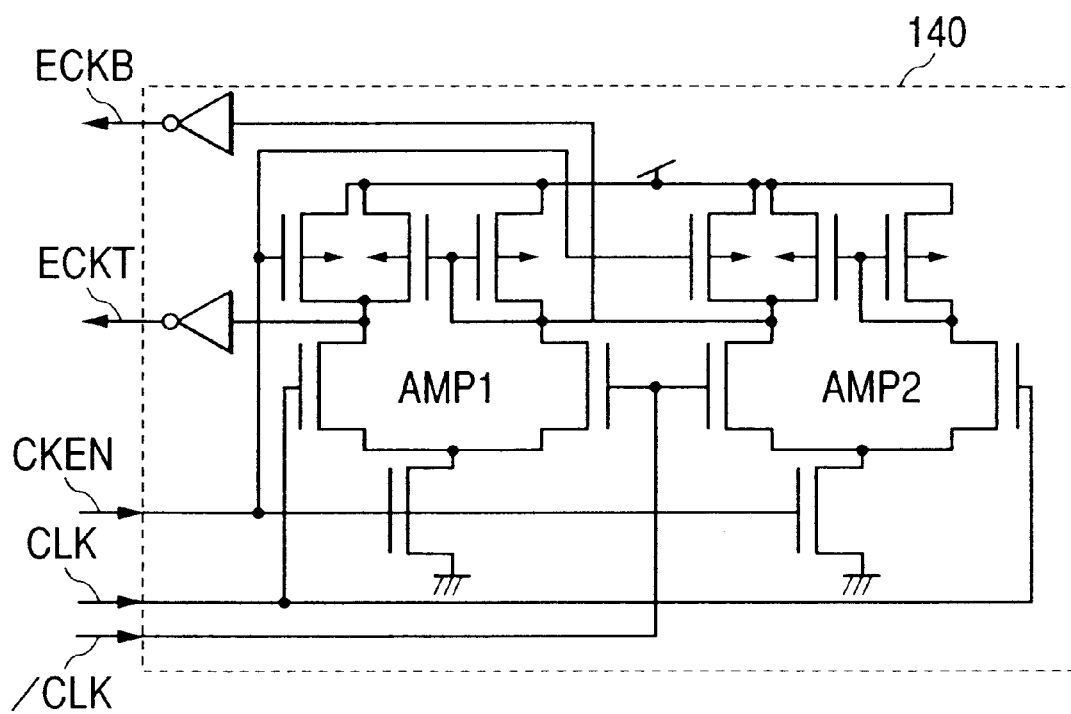
FIG. 4 is a circuit diagram showing a specific example of an input buffer circuit employed in an SDRAM used as one example of a semiconductor memory device effective for application of the present invention.

A more specific configuration of the DLL circuit according to the present embodiment and a control method thereof will next be described. Firs of all, as shown in FIG. 4, the input buffer circuit 140 has a configuration wherein two differential amplifier circuits AMP1 and AMP2 each including a pair of input differential MOSFETs, a current source MOSFET connected to common sources thereof, and a pair of active load MOSFETs connected to their drains are utilized in combination. The input buffer 140 plays a role in amplifying differential clock signals CLK and /CLK inputted from the outside of a chip and outputting them as differential clocks ECKT and ECKB each having a CMOS level.

Incidentally, CKEN is a clock enable signal applied to gate terminals of constant current MOSFETs to on-off control operating currents, thereby controlling the operation of the input buffer 140. Although not restricted in particular, MOSFETs which have gate terminals to which the clock enable signal CKEN is similarly applied, and which are turned on and off complementarily to the current source MOSFETs to thereby fix output potentials to Vcc at current cut-off, are connected in parallel with their corresponding load MOSFETs on the output node sides. The combination of the two differential amplifier circuits AMP1 and AMP2 in parallel is done to perfectly set the circuit symmetrically to thereby make signal delays to be perfectly identical to each other on the true and false sides of the differential clock signals CLK and /CLK. The differential clock ECKT and ECKB signals outputted from the input buffer circuit 140 are supplied to the variable delay circuit 101 through the switch circuits 110 and 111.

Figure 5:
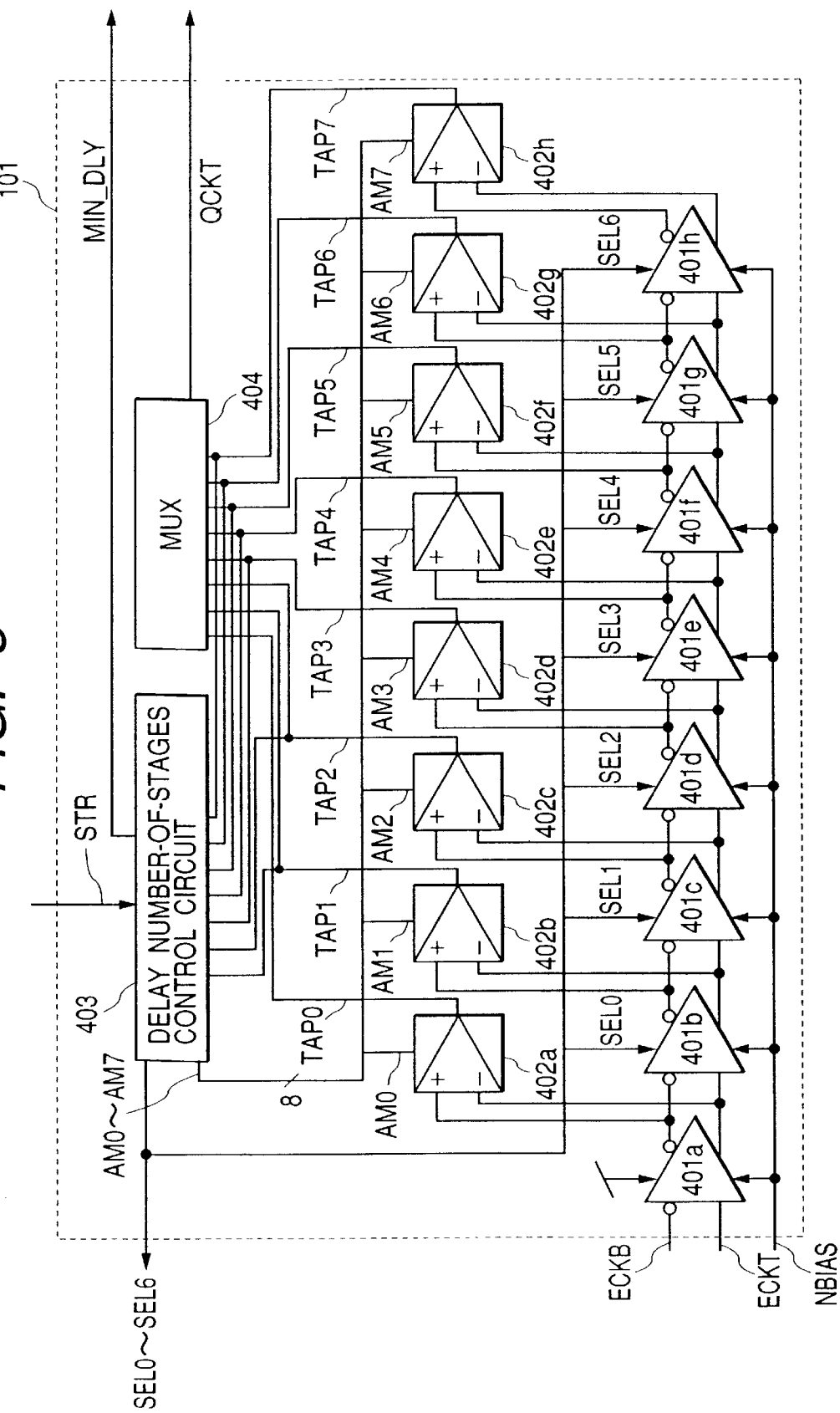
FIG. 5 is a block diagram illustrating a specific example of a variable delay circuit employed in the DLL circuit according to the first embodiment.

As shown in FIG. 5, the variable delay circuit 101 comprises eight variable delay elements 401a through 401h connected in series, eight differential amplifiers 402a through 402h respectively provided in association with the variable delay elements 401a through 401h, a delay number-of-stages control circuit 403 for controlling the activation/deactivation of the variable delay elements 401a through 401h and differential amplifiers 402a through 402h, and a multiplexer (MUP) 404 for selectively outputting any of outputs TAP0 through TAP7 produced from the differential amplifiers 402a through 402h.

Figure 6A:
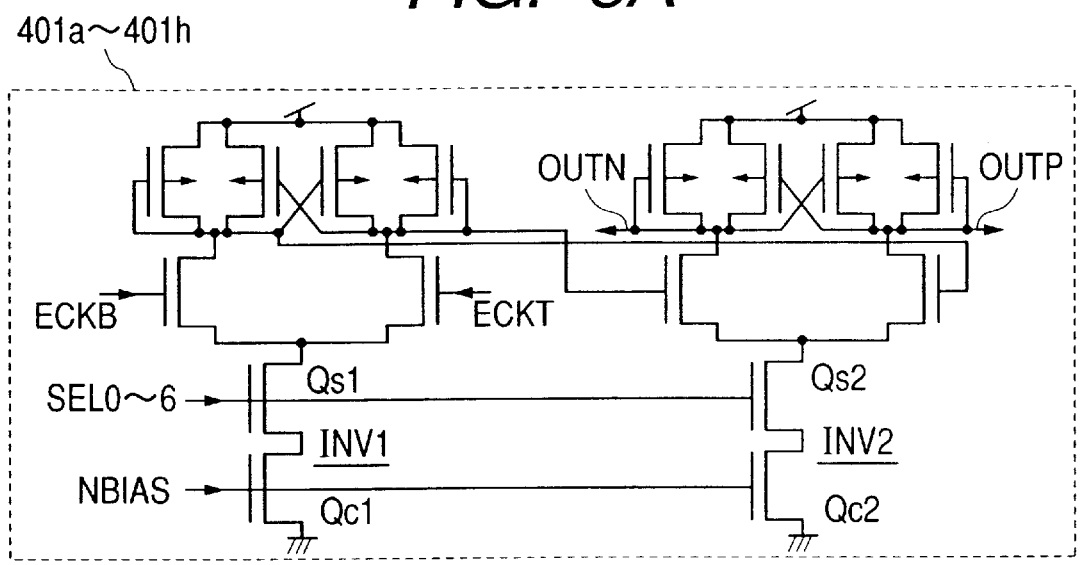
FIGS. 6A and 6B are respectively circuit diagrams showing specific examples of variable delay elements each of which constitutes a variable delay circuit employed in the DLL circuit according to the first embodiment.

FIG. 6A shows a specific circuit example of one of the variable delay elements 401a through 401h. Each of the variable delay elements 401 is configured as a circuit wherein two differential inverters INV1 and INV2 are connected in series. Each of the differential inverters INV1 and INV2 has a circuit configuration similar to a normal differential amplifier circuit. A bias voltage NBIAS outputted from the bias circuit 109 (see FIG. 1) is applied to gate terminals of current source MOSFETs Qc1 and Qc2 to control the differential inverters INV1 and INV2. Switch MOSFETs Qs1 and Qs2 are respectively connected in series with the current source MOSFETs Qc1 and Qc2. Select control signals SEL0 through SEL6 delivered from the delay number-of-stages control circuit 403 are applied to their corresponding gate terminals of switch MOSFETs Qs1 and Qs2 of the delay elements 401b through 401h corresponding to the second stage and later. Thus, only the circuits in which the signals are rendered high in level, are operated. Further, loads in which gate-drain coupled MOSFETs and MOSFETs whose output nodes are cross-connected to their corresponding gate terminals, are connected in parallel, are provided on the drain sides of input differential MOSFETs. Thus, the symmetric property of each circuit is assured and hence the delays of the signals become precisely identical to each other on the true and false sides. The series-connection of the two differential inverters INV1 and INV2 produces a large delay as compared with one inverter.

In each of the variable delay elements 401a through 401h configured as described above, an operating current for the differential inverter varies according to the potential of the bias voltage NBIAS. Therefore, a delay amount from the input of each signal to the output thereof changes according to the magnitude of the value of the current. Described specifically, when the potential of the bias voltage NBIAS rises, the delay amount decreases, whereas when the potential thereof drops, the delay amount increases.

Figure 6B:
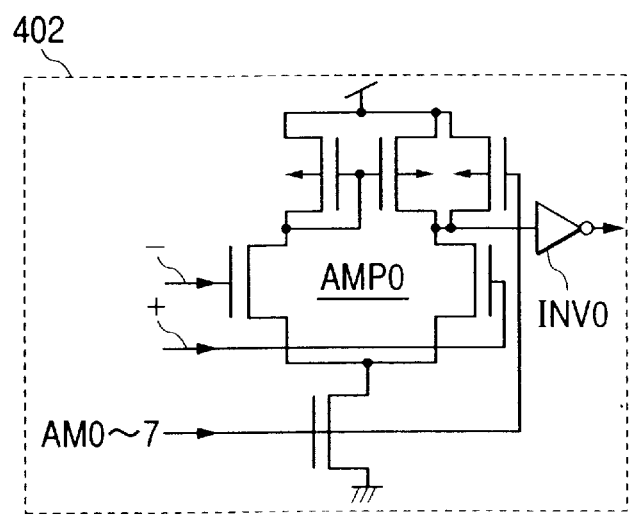

Since the operating currents are controlled according to the potential of the bias NBIAS and the switch MOSFETs Qs1 and Qs2 are respectively series-connected to the current source MOSFETs Qc1 and Qc2 in the variable delay elements 401a through 401h, their outputs become small-amplitude differential signals respectively. Thus, as shown in FIG. 6B, differential amplifiers 402a through 402h each comprising a differential amplifier circuit AMP and an inverter circuit INV0 for further waveform-shaping the output thereof, converting it to a CMOS level and outputting the same therefrom are provided to amplify the output signals of the variable delay elements 401a through 401h so as to reach their corresponding CMOS levels.

In each of the differential amplifiers 402a through 402h, an operating current used therefor is on-off controlled according to each of activation control signals AM0 through AM7 outputted from the delay number-of-stages control circuit 403. Each circuit stops operating at current cut-off to thereby output a low level (0V) through the output inverter INV0. The differential amplifier circuit AMP0 has the same configuration as one differential amplifier circuit in the circuit shown in FIG. 4. The two differential amplifier circuits are not utilized in combination as distinct from FIG. 4 because each of the differential amplifiers 402a through 402h may output a single signal without producing its differential output.

The delay number-of-stages control circuit 403 is a circuit for controlling how many stages of the variable delay elements 401 would pass clocks ECKT and ECKB inputted to the variable delay circuit 101 therethrough during up to the output thereof. It is configured so as to perform delay number-of-stages control, based on outputs TAP0 through TAP7 of the differential amplifiers 402a through 402h. When it is desired to cause the clocks to pass through the variable delay elements 401 corresponding to four stages, for example, the signals SEL0 through SEL3 are respectively rendered high in level and the SEL4 through SEL6 are respectively rendered low in level. Further, the activation control signal AM4 with respect to the differential amplifiers 402a through 402h is defined as high in level, and the activation control signals AM0 through AM3 and AM5 through AM7 other than AM4 are defined as low in level. Thus, the clocks ECKT and ECKB inputted to the variable delay circuit 101 pass through the variable delay elements 401a through 401d. Since, however, the variable delay elements 401e through 401h stop their circuit operation, they are controlled so that the clocks do not pass therethrough. A signal outputted from the variable delay element 401d is amplified by its corresponding differential amplifier 402d only activated by the activation control signal AM4 so as to reach a CMOS level, which in turn passes through the multiplexer 404 and is thereafter outputted as a clock QCKT. Owing to such control, the clocks ECKT and ECKB pass through the four-stage variable delay elements 401a through 401d between the input thereof and the output thereof. The delay number-of-stages control circuit 403 can arbitrarily set the number of stages of the variable delay elements 401 to 1 to 8.

Even if the select control signals SEL0 through SEL6 are all rendered high in level and the variable delay elements 401a through 401h are all activated in the variable delay circuit 101 configured as shown in FIG. 5, a similar delay time can be obtained if any of the differential amplifiers 402a through 402h is selectively activated by one of the activation control signal AM0 through AM7. However, the extra variable delay elements 401 may preferably be deactivated based on the select control signals SEL0 through SEL6 as described above because power consumption can be reduced.

The multiplexer 404 is a circuit for selecting one of the output signals TAP0 through TAP7 of the differential amplifiers 402a through 402h and outputting it as QCKT. Since, however, only one differential amplifier 402 is selected by any of the activation control signals AM0 through AM7 in the circuit employed in the embodiment shown in FIG. 5, the multiplexer 404 may be a simple eight-input OR circuit.

Figure 7:
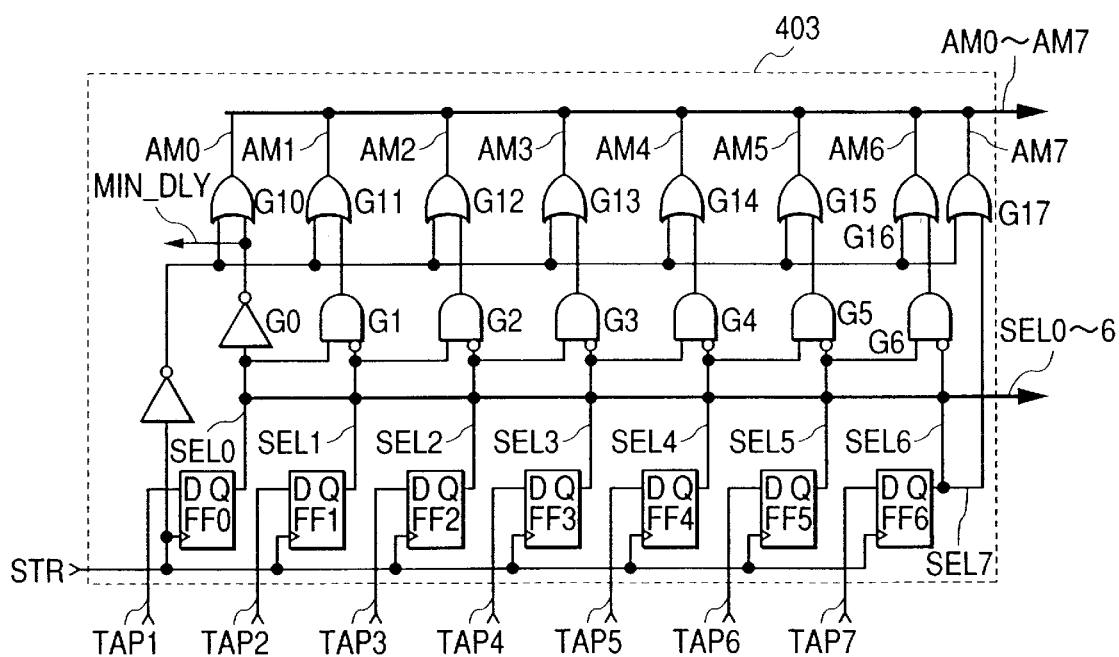
FIG. 7 is a circuit diagram illustrating a specific example of a delay number-of-stages control circuit employed in the DLL circuit according to the first embodiment.

FIG. 7 shows an example of a specific circuit configuration of the delay number-of-stages control circuit 403. As shown in FIG. 7, the delay number-of-stages control circuit 403 comprises flip-flops FF0 through FF6 for receiving the output signals TAP0 through TAP7 of the differential amplifiers 402a through 402h as input data signals respectively and receiving the start signal STR of the DLL control circuit 106 as a common clock input, an inverter G0 for inverting the output of FF0, AND gates G1 through G6 for respectively receiving the outputs of the FF1 through FF6 at one inversion input terminals and respectively receiving the outputs of the flip-flops corresponding to the preceding stages at the other input terminals to thereby perform their AND operations, OR gates G10 through G16 for respectively receiving signals outputted from the inverter G0 and the AND gates G1 through G6 as one input signals and receiving an inverted signal of the start signal STR as the other input signals, and an OR gate G17 for receiving the output of the flip-flop FF6 and the inverted signal of the start signal STR as input signals. The delay number-of-stages control circuit 403 outputs the outputs of the flip-flops FF0 through FF6 as the select control signals SEL0 through SEL6 with respect to the variable delay elements 401a through 401h, and outputs the outputs of the OR gates G10 through G17 as the activation control signals AM0 through AM7 with respect to the differential amplifiers 402a through 402h. Further, the delay number-of-stages control circuit 403 outputs the output of the inverter G0 as a minimum delay signal MIN_DLY to be described later.

In the delay number-of-stages control circuit 403 as will be described in details later, the select control signals SEL0 through SEL6 outputted therefrom are set as follows. With a certain stage i (where i=0 to 6) of the flip-flops FF0 through FF6 as the boundary, select control signals SEL0 through SEL6 outputted from the stages preceding it are rendered high in level, and select control signals SELi+1 through SEL6 outputted from the subsequent stages are rendered low in level. As to the activation control signals AM0 through AM7 outputted from the delay number-of-stages control circuit 403, the logic gates G0 through G6 are activated to bring only respective one signals AMi+1 corresponding to their stages to a high level.

The clock QCKT outputted from the variable delay circuit 101 is inputted to the replica delay circuit 102 simultaneously with being outputted to the outside of DLL. As described above, the replica delay circuit 102 is a circuit for giving a predetermined delay amount (t1+t3) equivalent to the sum of a delay amount t1 of the input buffer 140 and a delay amount t3 of the output circuit 120 to the input clock QCKT. Since the accuracy of a delay amount of the replica delay circuit 102 directly relates to the accuracy of the phase of each data output, a high-accuracy delay amount is required. However, several circuit forms have already been proposed in the past. Since the conventionally-used replica circuit is used in the present embodiment, the details thereof will be omitted herein. In brief, the replica delay circuit 102 takes a configuration wherein a circuit having the same configuration as the input buffer 140 and a circuit having the same circuit configuration as the output circuit 120 are connected in series, thereby obtaining the predetermined delay amount (t1+t3).

Figure 8A:
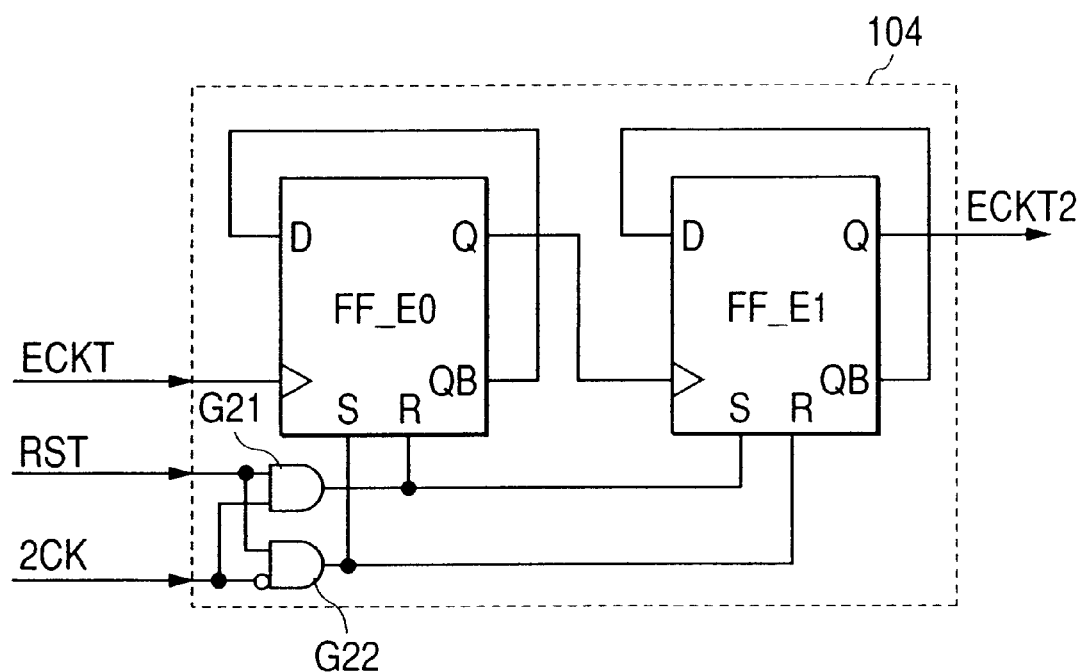
FIGS. 8A and 8B are respectively block diagrams showing specific examples of dividers employed in the DLL circuit according to the first embodiment.
Figure 8B:
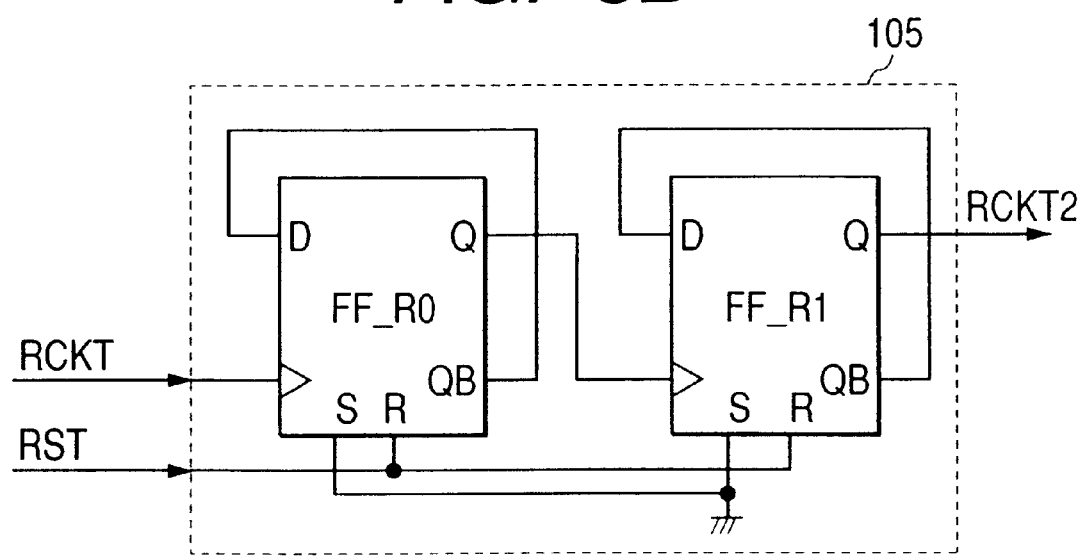

A clock RCKT delayed by the replica delay circuit 102 is by-four divided by the divider 105 to thereby produce it as a clock RCKT2. A clock ECKT captured by the input buffer 140 is also by-four divided by the divider 104 in a manner similar to the above to thereby produce a clock ECKT2. The divider 104 is configured in such a manner that the phase of the clock ECKT2 at this time reaches the phase of ECKT2 (n=1) shown in FIG. 3(c) when a control signal 2CK supplied from the DLL control circuit is low in level, whereas when the control signal 2CK is high in level, the phase thereof reaches the phase of ECKT2 (n=2) shown in FIG. 3(d). Dividing the clocks ECKT and RCKT by the dividers 104 and 105 allows prevention of the harmonic lock as described above. FIGS. 8A and 8B respectively show examples of the configurations of the dividers 104 and 105.

As shown in FIGS. 8A and 8B, the dividers 104 and 105 respectively comprise flip-flops FF_E0 and FF_E1 with two asynchronous sets and reset terminals, which have data terminals to which inverted outputs are respectively inputted. A clock ECKT is inputted to a clock terminal of the previous-stage flip-flop FF_E0, and an output Q of the previous-stage flip-flop FF_E0 is inputted to a clock terminal of the subsequent-stage flip-flop FF_E1. The flip-flops FF_E0 and F_E1 with the asynchronous sets and reset terminals are respectively asynchronously brought to a set state regardless of the input clocks if a high level is inputted to set terminals S. Thus, the outputs Q are brought to a high level, and inverted outputs QB are brought to a low level, respectively. When a high level is inputted to the reset terminals R, the flip-flops FF_E0 and FF_E1 are asynchronously brought to a reset state, so that the outputs Q are brought to a low level and the inverted outputs QB are brought to a high level, respectively.

As shown in FIG. 8A, the divider 104 is provided with AND gates G21 and G22 which respectively receive a reset signal RST, and the control signal 2CK or its inverted signal as input signals. The output of the AND gate G21 is inputted to the reset terminals of the flip-flops FF_E0 and FF_E1, and the output of the AND gate G22 is inputted to the set terminals of the flip-flops FF_E0 and FF_E1. Thus, an ECKT2 (n=1) divided so as to reach the phase shown in FIG. 3(c) or an ECKT (n=2) divided so as to reach the phase shown in FIG. 3(d) is formed according to the control signal 2CK. In the divider 105 as shown in FIG. 8B, a reset signal RST is directly inputted to reset terminals of flip-flops FF_R0 and FF_R1, a ground potential is applied to set terminals thereof, and the phase of a divided output signal is fixed.

Incidentally, while the divider 105 is provided immediately after the replica delay circuit 102 to simplify the description of the circuit in the present embodiment, the divider 105 may be provided in a stage preceding the replica delay circuit 102. It is thus possible to reduce current consumption of the replica delay circuit 102. Since the Equation (1) is established even in this case, the phase of output data DQ and the phase of a data strobe signal DQS are properly controlled.

Figure 9:
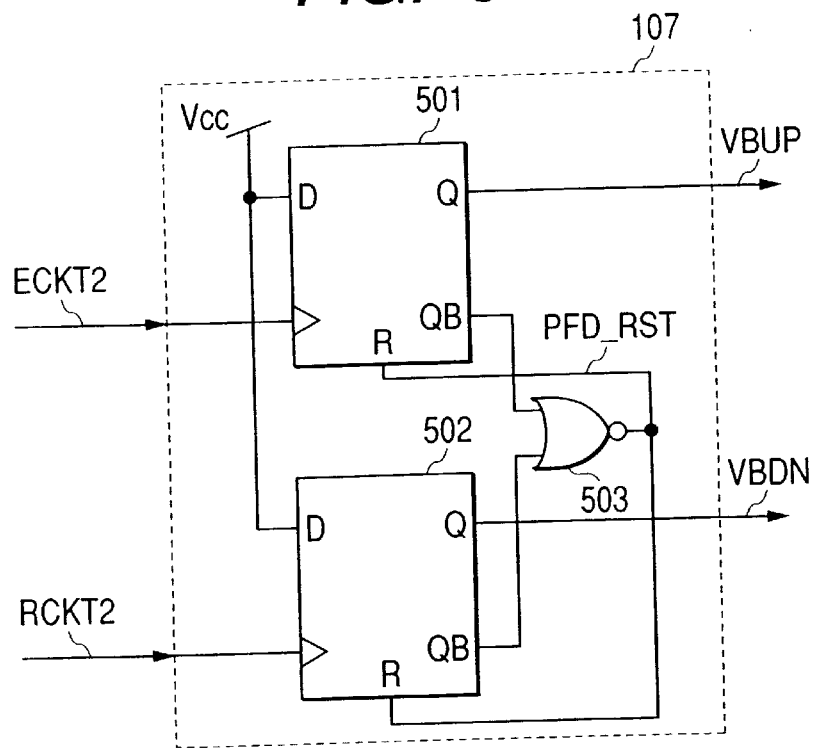
FIG. 9 is a block diagram illustrating a specific example of a phase frequency detection circuit or detector employed in the DLL circuit according to the first embodiment.

FIG. 9 shows a specific example of the phase frequency detector 107 for making a phase comparison between the clocks ECKT2 and RCKT2 divided by the dividers 104 and 105. The phase frequency detector 107 comprises two flip-flops 501 and 502 and one NOR gate circuit 503. Respective data input terminals D are respectively connected to a source voltage Vcc. The clocks ECKT2 and RCKT2 divided by the dividers 104 and 105 are respectively inputted to their corresponding clock terminals. The phase frequency detector 107 takes in high levels from the data input terminals in synchronism with the rising edges of the clocks. Further, the flip-flops 501 and 502 respectively have asynchronous reset terminals R and are configured so that the output of the NOR gate circuit 503 for receiving inverted outputs QB of the flip-flops 501 and 502 as input signals is inputted to the reset terminals as a reset signal. When the reset terminals are respectively brought to a high level, Q outputs are immediately reset to a low level and QB outputs are immediately reset to a high level respectively regardless of the states of the input clocks.

Figure 3:
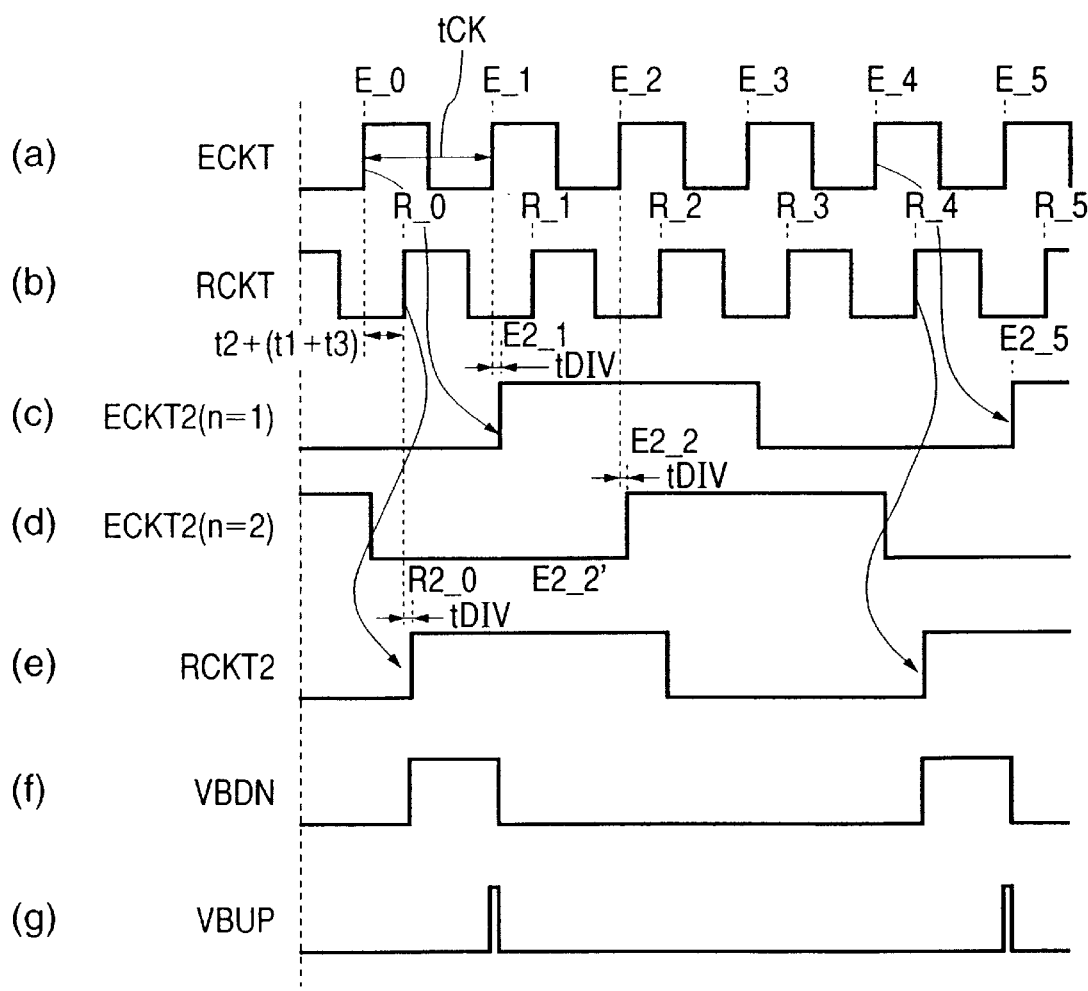
FIG. 3 is a timing chart for describing a harmonic lock developed in the DLL circuit according to the first embodiment.

In the phase frequency detector 107, when the rising edge of the clock RCKT2 is inputted before the rising edge of the ECKT2, the output Q of the flip-flop 502 is brought to a high level, and the inverted output QB thereof is brought to a low level as shown in FIGS. 3(c) and 3(e). Further, an output signal VBDN indicative of a phase lead is changed to a high level as shown in FIG. 3 (f). Next, when the rising edge of the clock ECKT2 is inputted, the output Q of the flip-flop 501 is brought to a high level and the inverted output QB thereof is brought to a low level respectively. When the inverted outputs QB of the flip-flops 501 and 502 are both rendered low in level, a PFD_RST signal corresponding to the output of the NOR gate circuit 503 is changed to a high level immediately thereafter. The PFD_RST signal is inputted to their corresponding reset terminals of the flip-flops 501 and 502, and the outputs Q thereof are respectively changed to a low level. Thus, as shown in FIGS. 3(f) and 3(g), long pulses appear in the output signal VBDN, and short pulses appear in the output signal VBUP. When the rising edge of the ECKT2 is earlier than that of the RCKT2 in reverse, short pulses appear in the output signal VBDN and long pulses appear in the output signal VBUP.

Figure 10:
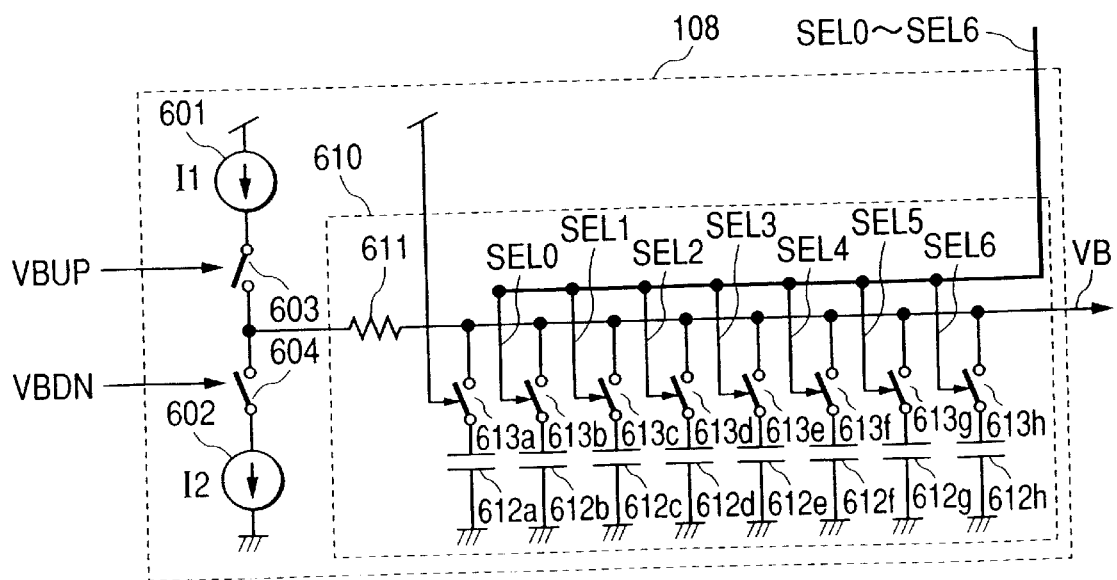
FIG. 10 is a circuit diagram showing a specific example of a charge pump employed in the DLL circuit according to the first embodiment.

The difference between pulse output periods for the VBUP and VBDN signals is equivalent to a phase difference between the rising edges of the clocks ECKT2 and RCKT2. The VBUP and VBDN signals are inputted to the charge pump 108 from which a voltage VB corresponding to a detected phase difference is generated. As shown in FIG. 10, the charge pump 108 comprises a low pass filter 610 comprised of a resistor 611 and a plurality of capacitors 612a through 612h, two current sources 601 and 602 and two MOS switches 603 and 604.

When a positive pulse of an up signal VBUP is now inputted to the charge pump 108, the MOS switch 603 is brought into conduction so that a current I1 from the current source 601 is supplied to the filter 610, where the capacitors 612a through 612h are charged to thereby increase the potential of an output voltage VB. On the other hand, when a positive pulse of a down signal VBDN is inputted, the MOS switch 604 is brought into conduction, so that electrical charges flow out from the capacitors 612a through 612h of the filter 610 owing to a current I2 of the current source 602, thereby lowering the potential of an output voltage VB.

The input signals VBUP and VBDN might simultaneously be brought to a high level in terms of the configuration of the phase frequency detector 107. In such a case, the current I1 produced from the current source 601 directly flows out into the current source 602, and the potential of the output voltage VB remains unchanged. Thus, the potential of the output voltage VB rises or drops by the difference in pulse width between the signals VBUP and VBDN.

In the charge pump employed in the present embodiment, the capacitances of the capacitors of the filter 610 can be changed by on-off controlling switches 613a through 613h respectively provided in association with the eight capacitors 612a through 612h according to the select control signals SEL0 through SEL6 for controlling the number of delay stages of the variable delay circuit 101. This is because the amount of change in the output voltage VB of the charge pump 108 is adjusted according to the number of delay stages of the variable delay circuit 101 to linearize a change in the delay amount of the variable delay circuit 101.

Figure 11A:
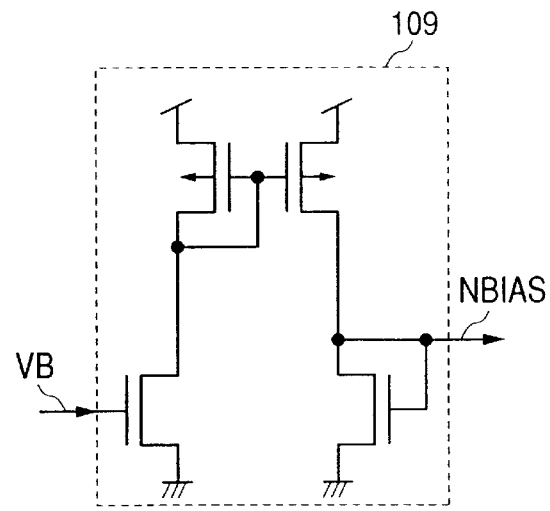
FIGS. 11A, 11B and 11C are respectively circuit diagrams showing specific examples of current mirror type bias circuits employed in the DLL circuit according to the first embodiment.
Figure 11B:
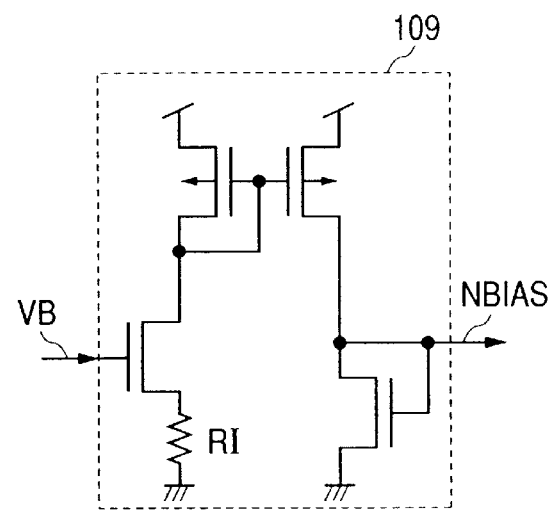
Figure 11C:
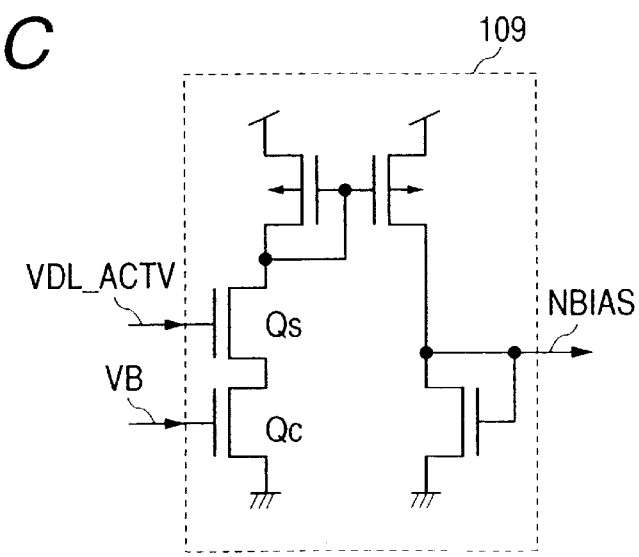

Namely, the voltage VB generated by the charge pump 108 is supplied to each of bias circuits 109 comprised of current mirror circuits shown in FIGS. 11A, 11B and 11C. Thus, a current that flows through each variable delay element of the variable delay circuit 101, is controlled according to a current outputted from the bias circuit 109, and the delay amount of each stage changes according to the magnitude of the current. However, the number of stages for the operated variable delay elements differs according to the select control signals SEL0 through SEL6. Therefore, when the amount of change in output voltage VB with respect to the input pulse from the charge pump 108 is constant, the total delay time of the variable delay circuit 101 becomes k times when the number of stages for the operated variable delay elements is defined as k.

Namely, when the bias voltage VB is changed by ΔB, the amount Δt2 of change in delay time t2 at the time that the variable delay elements are provided as eight stages, reaches eight times the amount of change Δt2 in the case of one-stage variable delay element. There is a possibility that due to this influence, a phase shift of the DLL circuit will increase when the number of delay stages is large, and the circuit will oscillate in the worst case. In the charge pump 108 employed in the present embodiment, however, the amount of change in output voltage VB with respect to the input pulse is kept in inverse proportion because the capacitance values of the capacitors 612a through 612h are controlled according to the select control signals SEL0 through SEL6 to thereby change the capacity or capacitance so as to increase it as the number of delay stages for the variable delay circuit 101 increases. As a result, the amount of change in delay time t2 of the variable delay circuit 101 with respect to the pulse widths of the signals VBUP and VBDN becomes approximately constant regardless of the number of operation stages and hence the operation of the variable delay circuit 101 becomes stable.

Incidentally, while the bias circuit 109 shown in FIG. 11A makes use of the simple current circuit, the bias circuit 109 having such a configuration as shown in FIG. 11B may be used to adjust the amount-of-delay control characteristic and the like of the variable delay circuit 101. Described specifically, an input voltage VB-output current characteristic of the bias circuit shown in FIG. 11A is represented as a quadratic function in the bias circuit. However, a current generated by an input voltage VB and an output voltage NBIAS is represented as a linear or primary function in the bias circuit shown in FIG. 11B. Therefore, a voltage-amount-of-delay control characteristic approximates more linearity as compared with FIG. 11A.

Thus, the description of the configuration of the DLL according to the present embodiment is concluded. A method of controlling the DLL circuit according to the present embodiment will next be described.

A description will first be made of phase control on the DLL circuit. When the phase of a clock RCKT2 inputted to the phase frequency detector 107 leads the phase of a clock ECKT2, a VBDN pulse is outputted to reduce the potential of a bias voltage VB, thereby increasing the delay amount of the variable delay circuit 101, whereby the phase of the clock RCKT2 is controlled so as to lag. On the other hand, when the phase of the clock RCKT2 inputted to the phase frequency detector 107 lags the phase of the ECKT2, a VBUP pulse is outputted to raise the potential of the bias voltage VB, thereby reducing the delay amount of the variable delay circuit 101, whereby the phase of the clock RCKT2 is controlled so as to lead. Owing to such a feedback loop, the phases of the clocks ECKT2 and RCKT2 are adjusted so as to become equal to each other at all times. Thus, the Equation 1 is established and hence data DQ0 through DQ15 coincident in phase with input clocks CLK and /CLK are outputted.

A description will next be made of control for changing the number of stages for the variable delay elements 401 in the variable delay circuit 10 according to a clock cycle tCK to enlarge a lock range with reference to FIG. 12. Incidentally, let's assume that the bias voltage VB is first reset to a Vcc level, the delay amount per one stage, of each of the variable delay elements 401a through 401h is tD, and the selector switches 110 and 111 are switched so as to supply the outputs of the second replica delay circuit 103 to the variable delay circuit 101 according to the setting of a control signal STR outputted from the DLL control circuit 106 to a low level.

When a reset signal RST is inputted to the DLL control circuit 106, the DLL control circuit 106 outputs differential signals SCKT and SCKB changed as shown in FIG. 12(b) in synchronism with a rising timing T1 of a clock ICKT outputted from the input buffer 140 which takes in the external clocks CLK and /CLK. Incidentally, the reset signal RST inputted to the DLL control circuit 106 is generated when control logic of DDR SDRAM has received a mode register set command or a self-refresh end command, for example. The signals SCKT and SCKB outputted from the DLL control circuit 106 are supplied with a delay equivalent to the amount of (t1+t3+tm) by the second replica delay circuit 103, which in turn are outputted as such signals SRCKT and SRCKB as shown in FIG. 12(d). Here, tm indicates a pre-set phase margin to cope with a circuit error, a source voltage subsequent to the start of the operation of DLL, and a change in temperature. While the detailed meaning of tm will be described later, it is set to a relatively short time like 1 ns, for example.

The signals SRCKT and SRCKB are inputted to the variable delay circuit 101 having such a configuration as shown in FIG. 5 through the selector switches 110 and 111. The variable delay circuit 101 provides delays of tD every one stages of the variable delay elements 401 to thereby form such delayed signals as shown in FIGS. 12(e) through 12(i) in sequence. The delayed signals are respectively supplied to the delay number-of-stages control circuit 403 and the multiplexer 404 through the differential amplifiers 402a through 402h. On the other hand, when a control signal STR outputted from the DLL control circuit 106 is low in level, the delay number-of-stages control circuit 403 brings one input signals of the OR gates G10 through G17 to a high level to thereby output all of activation control signals AM0 through AM7 as a high level respectively. Therefore, the differential amplifiers 402a through 402h of the variable delay circuit 101 are all activated so that the delayed signals shown in FIGS. 12(e) through 12(i) are outputted as TAP0, TAP1, . . . in sequence, followed by supply to the multiplexer 404. Of these, TAP1 through TAP7 are supplied even to the delay number-of-stages control circuit 403. While the output of the multiplexer 404 gets out of order at this time, no problem occurs because the phase control is not performed in this state.

Figure 12:
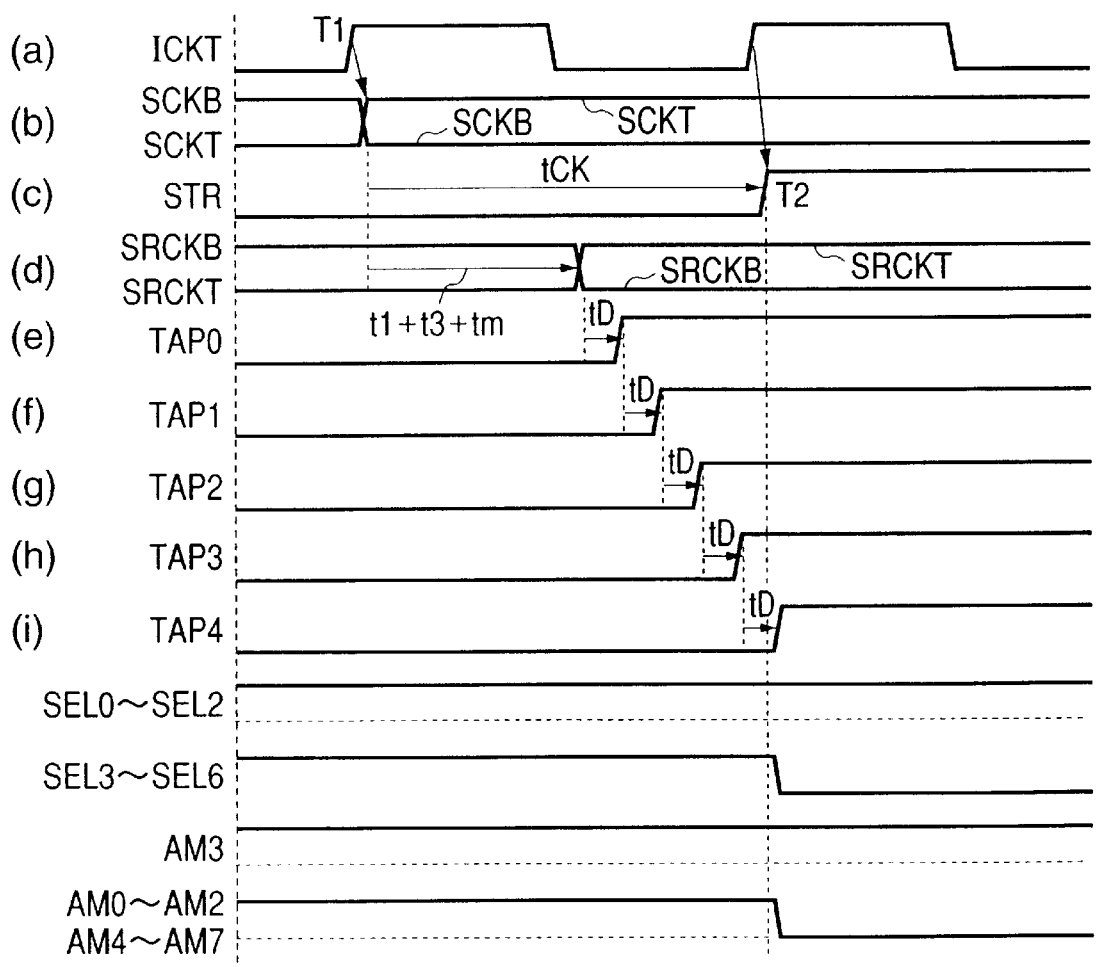
FIG. 12 is a timing chart showing changes in each individual signals at the measurement of the number of stages in a 1 clock cycle in the DLL circuit according to the first embodiment.

Let's next assume that as shown in FIG. 12(c), the STR signal changes from a low to a high levels with a timing T2 after the elapse of tCK since the SCKT and SCKB signals have changed stepwise. With the STR signal as a clock, the flip-flops FF0 through FF6 of the delay number-of-stages control circuit 403 shown in FIG. 7 simultaneously latch the delayed signals TAP1, TAP2, . . . outputted from the variable delay circuit 101 respectively. In the case of the timings shown in FIG. 12, TAP0 through TAP3 are high in level, and TAP4 and ones subsequent it are low in level when the STR signal changes from the low to high levels. Therefore, the flip-flops FF0 through FF2 of the delay number-of-stages control circuit 403 respectively latch a high level, and the flip-flops FF3 through FF6 respectively latch a low level. By knowing to what stage of the flip-flops FF0 through FF6 the high level has been latched, the number of delay stages in which the signals are transmitted to within the variable delay circuit through the second replica delay circuit during one clock cycle tCK, can be recognized. It is understood that in the example illustrative of the timings shown in FIG. 12, the signals have been transmitted up to TAP3, i.e., the variable delay element 401d corresponding to the fourth stage during tCK.

As a result, in the delay number-of-stages control circuit 403 shown in FIG. 7, the output signals SEL0 through SEL2 of the output signals SEL0 through SEL6 of the flip-flops FF0 through FF6 respectively remain at a high level, and the output signals SEL3 through SEL6 are respectively changed to a low level, whereby only the activation signal AM3 of the activation signals AM0 through AM7 outputted from the OR gates G10 through G17 is outputted as a high level. The signals SEL0 through SEL6 and AM0 through AM7 are supplied to the variable delay circuit 101. As a result, the number of stages for the operated variable delay elements is determined as four. Incidentally, when the number of stages for the operated variable delay elements 401 is four, the delay time t2 of the variable delay circuit 101 at this time results in 4×tD.

When the state of control of the variable delay circuit 101 by the delay number-of-stages control circuit 403 is determined as described above, the switches 110 and 111 have already been switched to the selection sides of input clocks ICKT and ICKB at this time according to the change of the control signal STR to the high level, and thereby phase control is started. Thus, a delay amount Ddq from the input of the clocks CLK and /CLK immediately following the start of the phase control to the output of data DQ is given as follows:

$$Ddq = t1 + t2 + t3 \quad \text{(Equation 5)}$$
$$= t1 + 4 \times tD + t3$$

Here, tCK is found to fall within the following range from FIG. 12.

$$(t1+t3+tm)+4\times tD < tCK < (t1+t3+tm)+5\times tD \quad \text{(Equation 6)}$$

On the other hand, a phase difference Pdq between the output data DQ immediately following the start of the phase control and each of the clocks CLK and /CLK can be represented as follows:

$$Pdq = Ddq - n \times tCK$$

Since consideration is given to n=1 as shown in FIG. 12 herein, Pdq=Ddq−tCK. From the two Equations (5) and (6), the following expression is obtained:

$$-tm > Pdq > -(tm+tD)$$

It is thus understood that the phase of the output data DQ leads the clocks CLK and /CLK by tm~(tm+tD).

Accordingly, the number of stages for the variable delay circuit 101 can suitably be controlled as four. Incidentally, when the number of stages for the variable delay circuit 101 is three, the phase of the output data DQ leads the clocks CLK and /CLK by (tm+tD)~(tm+2tD). When the number of the stages for the variable delay circuit 101 is five, the phase of the output data DQ lags the same clocks by (tD−tm)~(2tD−tm). Therefore, there is a possibility that the time required up to the phase lock will become long and the phase lock will not be carried out.

When the switches 110 and 111 are changed over in the above-described manner in a state in which the number of delay stages for the variable delay circuit 101 is being controlled, the phase frequency detector 107 performs a phase comparison between the clock obtained by delaying the clock delayed by the variable delay circuit 101 by the replica delay circuit 102, and the clock supplied from the input buffer circuit 140 to thereby detect the phase difference −tm~−(tm+tD) and outputs such a signal VBDN as to decrease the phase difference. Thus, the delay amount of the variable delay circuit 101 changes (first increases) to reduce the phase difference. By repeating it, the DLL circuit is brought to a phase-locked state rapidly. Since the phase comparison of the phase frequency detector 107 is similar to the phase comparison between the output data DQ and the clocks CLK and /CLK, the phase of the output data DQ coincides with the phase of each of the clocks CLK and /CLK when phase-located.

On the other hand, since the aforementioned optimum number of stages for the variable delay circuit 101 is normally measured on power-on or the like, there is a possibility that a circuit's source voltage, temperature, etc. will change after the setting of the optimum number of stages, and the delay times t1 and t3 for the input buffer and output circuit will change. If the amount of change in t1+t3 is smaller than tm at this time, then the DLL circuit remains kept in a phase-locked state. Thus, a predetermined amount of tm can be given to the DLL circuit as a phase margin or allowance to prevent the DLL circuit from being released from the phase-locked state. Even in the case where a circuit error or the like is considered, the magnitude of tm can be adjusted to cause the DLL circuit to hold a margin set purely for the accommodation of the error in advance. Allowing the DLL circuit to have the margin equivalent to tm makes it possible to obtain a circuit stable for the source voltage, temperature and variations in process.

Making it possible to adjust the number of delay stages for the variable delay circuit 101 as described above yields a wider lock range as compared with a variable delay circuit in which the number of stages is fixed. Even in that case, the-minimum value of tCK is limited to tD+t1+t3 at the time that the number of delay stages is 1. In order to exceed this limitation, the present embodiment is configured so as to be capable of performing such control (2CK lock control) as shown in FIG. 2B, for causing t1+t2+t3 to coincide with the 2 clock cycles 2tCK. A description will be made below of the 2CK lock control.

Figure 13:
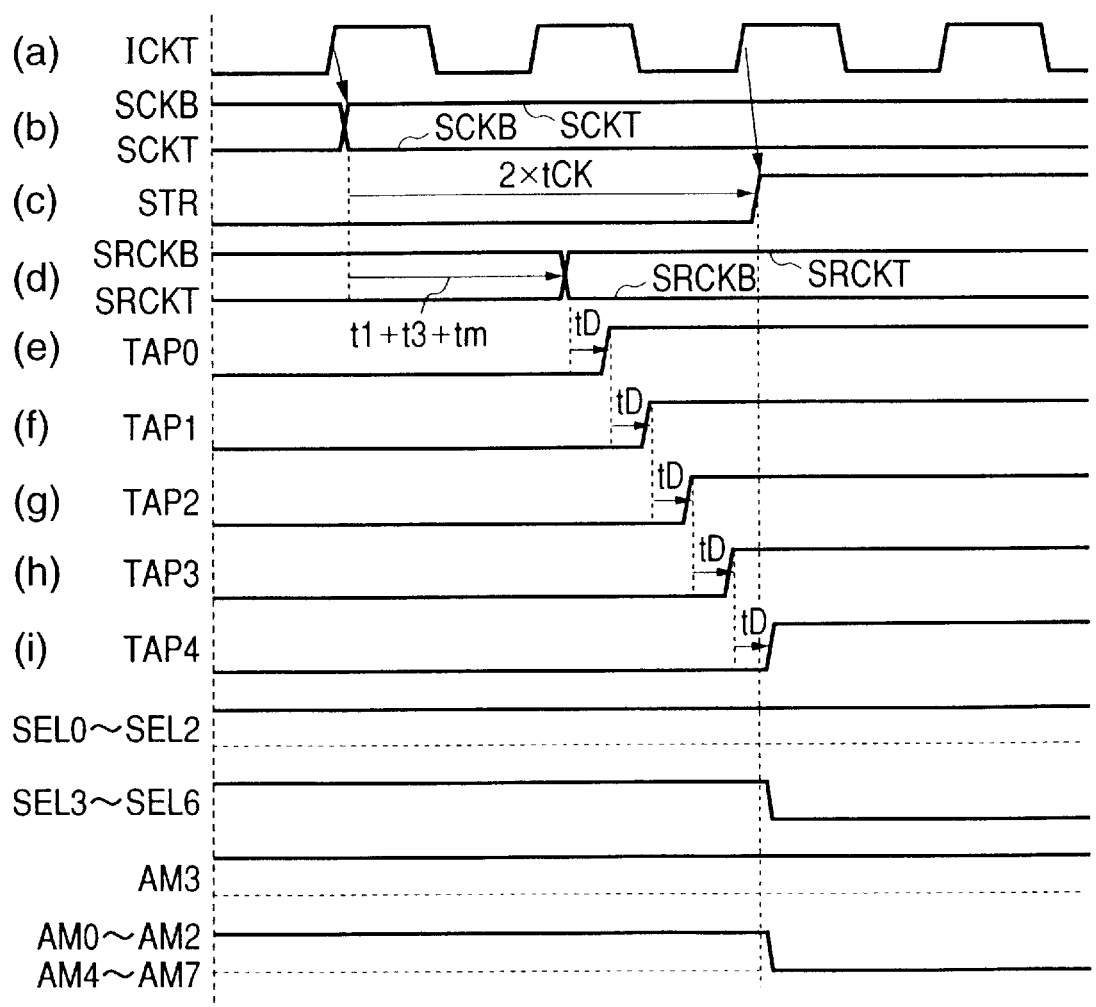
FIG. 13 is a timing chart illustrating changes in each individual signals at the measurement of the number of stages in two clock cycles in the DLL circuit according to the first embodiment.

When the 2CK lock control is carried out, the DLL control circuit 106 may raise an STR signal after 2×tCK after SCKT and SCKB signals have changed as shown in FIG. 13. Needless to say, control (nCK lock control) for causing t1+t2+t3 to coincide with an n clock cycle ntCK is theoretically allowed. At this time, the STR signal is raised after n×tCK since the SCKT and SCKB signals are outputted, whereby the optimum number of stages can be measured.

However, attempting the nCK lock control causes a limitation by the maximum value tCKmax of tCK. Namely, since the number of the stages for the variable delay circuit 101 is variable, a problem about tCKmax can be avoided by increasing the maximum number of stages. In this case, however, there is a possibility that harmful effects such as an increase in circuit scale, an increase in current consumption, etc. will appear. Thus, in the present embodiment, the value of n is switched to two stages as in the case where when the clock cycle tCK is large, 1CK lock control is performed, and when the clock cycle tCK is small, the 2CK lock control is performed, thereby achieving the enlargement of the lock range while avoiding the harmful effects. In the present embodiment, when the 2CK lock control is selected, the phase of the divide-by-four circuit 104 is changed to such an ECKT2 (n=2) as shown in FIG. 3(d).

Figure 14A:
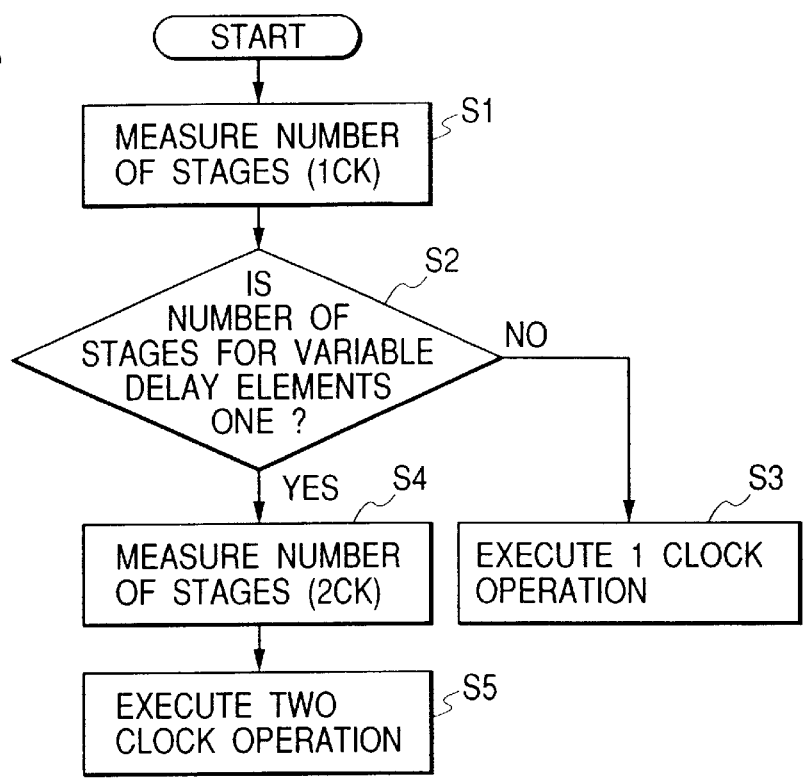
FIGS. 14A and 14B are respectively flowcharts showing procedures for nCK lock and number-of-stages determining processes in the DLL circuit according to the first embodiment.

Described specifically, the number of stages at 1CK lock control is measured immediately following the start of a DLL operation in a start sequence based on an MRS command indication, etc. in accordance with such a procedure as shown in FIG. 14A (Step S1). As a result, it is determined whether or not the optimum number of stages of the variable delay elements 401 is one or two or more (Step S2). If the optimum number of stages thereof is found to be two or more, then the 1CK lock control is performed (Step S3). On the other hand, when the optimum number of stages of the variable delay elements 401 is found to be one, then the optimum number of stages is next measured upon the 2CK lock control (Step S4). Thereafter, the 2CK lock control is performed based on the measured number of stages (Step S5).

Figure 14B:
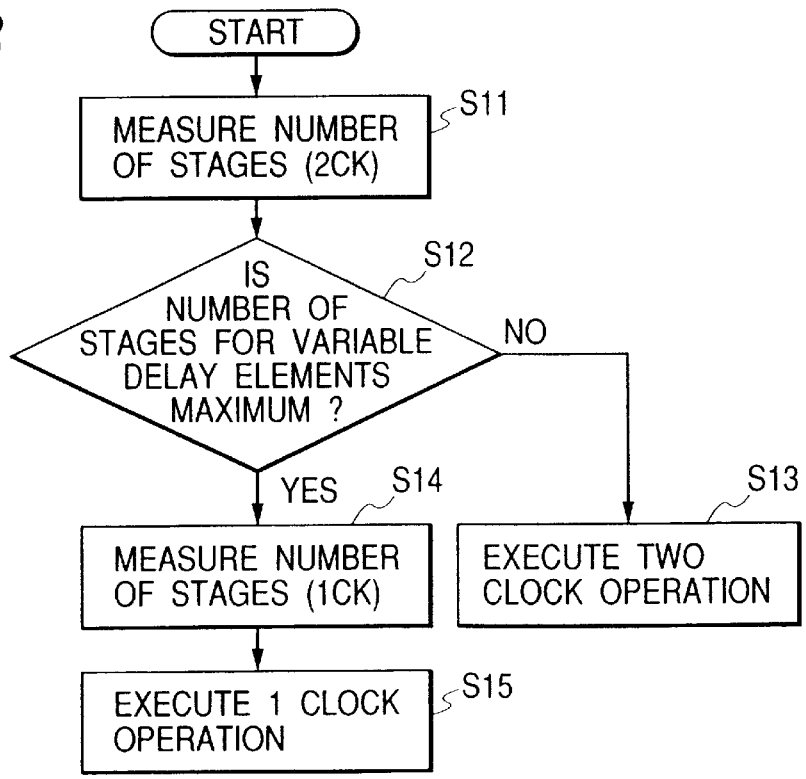

Incidentally, the number of stages at the 2CK lock control is measured immediately after the start of the DLL operation in the start sequence based on the MRS command indication, etc. as shown in FIG. 14B contrary to the procedure of FIG. 14A (Step S11). It is determined whether the optimum number of stages of the variable delay elements 401 is less than the maximum number of stages (eight in the present embodiment) (Step S12). If the optimum number of stages thereof is found to be less than the maximum number of stages, the 2CK lock control is performed (Step S13). If the optimum number of stages of the variable delay elements 401 is found to be equal to the maximum number of stages, then the number of stages is measured upon the 1CK lock control (Step S14). A similar lock range may be obtained in accordance with a procedure for performing the 1CK lock control, based on the measured number of stages (Step S15).

When automatic switching is made between the 1CK lock control and the 2CK lock control, the DLL control circuit 106 latches the value of a MIN_DLY signal, generates a 2CK signal and outputs it to the divider 104 in order to change the phase of a clock divided by the divide-by-four circuit 104 to the optimum phase by a phase comparison. As is understood by reference to FIG. 7, the MIN_DLY signal is a signal indicating that the number of the stages for the variable delay circuit 101 is set to one stage corresponding to the minimum. Therefore, the MIN_DLY signal is generated upon transition to the 2CK lock control from the determination of Step S2 shown in FIG. 14A. The divide-by-four circuit 104 changes the phase of the divided clock ECKT2 as shown in FIG. 3(d) when it has received the 2CK signal.

Of course, the selection of the nCK lock control is not limited to the 1CK lock control and the 2CK lock control. Various applications such as the selection thereof from the 1CK lock control, 2CK lock control and 3CK lock control, etc. are considered therefor. In this case, the division of each of the divide-by-four circuits 104 and 105 may be set to twice the value of n (six divisions in the case of the maximum 3CK lock, and eight divisions in the case of the maximum 4CK lock).

There is also considered an application wherein when an SDRAM equipped with the DLL circuit according to the present embodiment is used, it is configured so that the operating frequency thereof can be set by a register from outside the SDRAM, and the DLL circuit performs switching between the 1CK lock control and the 2CK lock control by reference to the operating frequency. It is, in this case, conceivable that the standard of the above-described DDR SDRAM is laid down.

Owing to the selection of the value of n in this way, the minimum clock cycle tCKmin can be reduced to the limit of the operating frequency of the circuit used in the DLL circuit. Since, however, the division ratios of the divide-by-four circuits 104 and 105 increase when n increases, the phase control is inevitably done once per 8×tCK when the divide-by-four circuits 104 and 105 are set as eight divisions. When n is increased at random, the DLL circuit has the potential not to follow sudden changes in voltage and temperature, etc. It is hard to consider that the values of t1 and t3 corresponding to the delay times of the input buffer and output circuit are dramatically reduced even if the process technology of an LSI become advanced. On the other hand, it is also considered that the clock cycle tCK increasingly decrease from now on with the advance in process technology, and the value of n increases. Therefore, a description will be made of an embodiment of a control system free of dependency on a divider.

Figure 15:
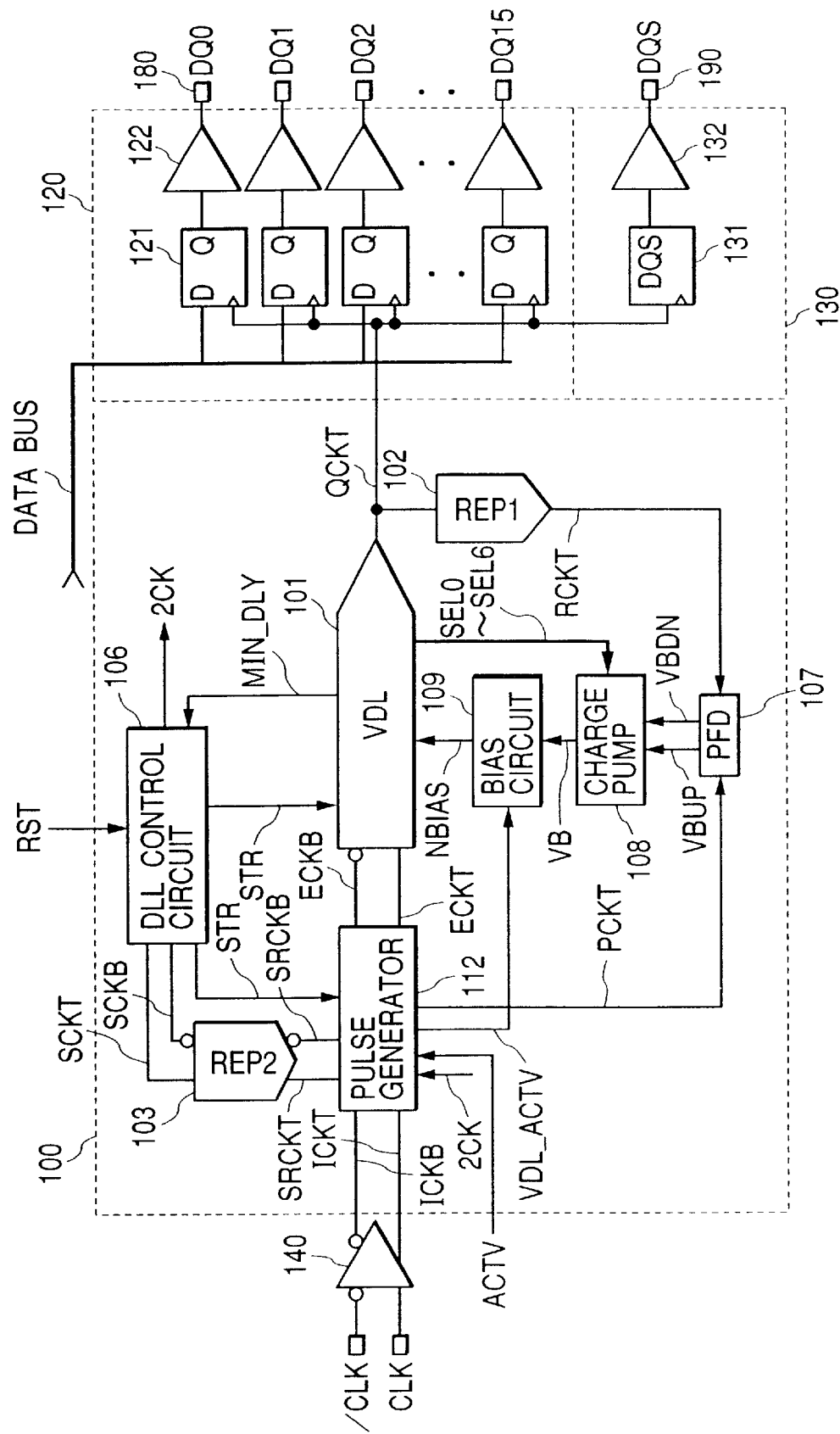
FIG. 15 is a block diagram showing a second embodiment of a DLL circuit to which the present invention is applied.

FIG. 15 shows an embodiment of a DLL circuit which has adopted a control system free of the use of the divide-by-four circuits 104 and 105 employed in the embodiment shown in FIG. 1. In the present embodiment, a pulse generator 112 is provided between an input buffer circuit 140 and a variable delay circuit 101 as an alternative to the divide-by-four circuits 104 and 105. Further, a bias generating circuit 109 is also different in circuit type from the bias generating circuit 109 shown in FIG. 1.

Since the DLL circuit is used to compensate for the phase of output data in a DDR SDRAM, the DLL circuit needs not to output an output latch clock QCKT. Described specifically, only when an active command ACTV or a read command READ is inputted thereto, the DLL circuit may output the clock QCKT. The DLL circuit according to the present embodiment is configured so as to operate in the following manner through the use of it.

Figure 16:
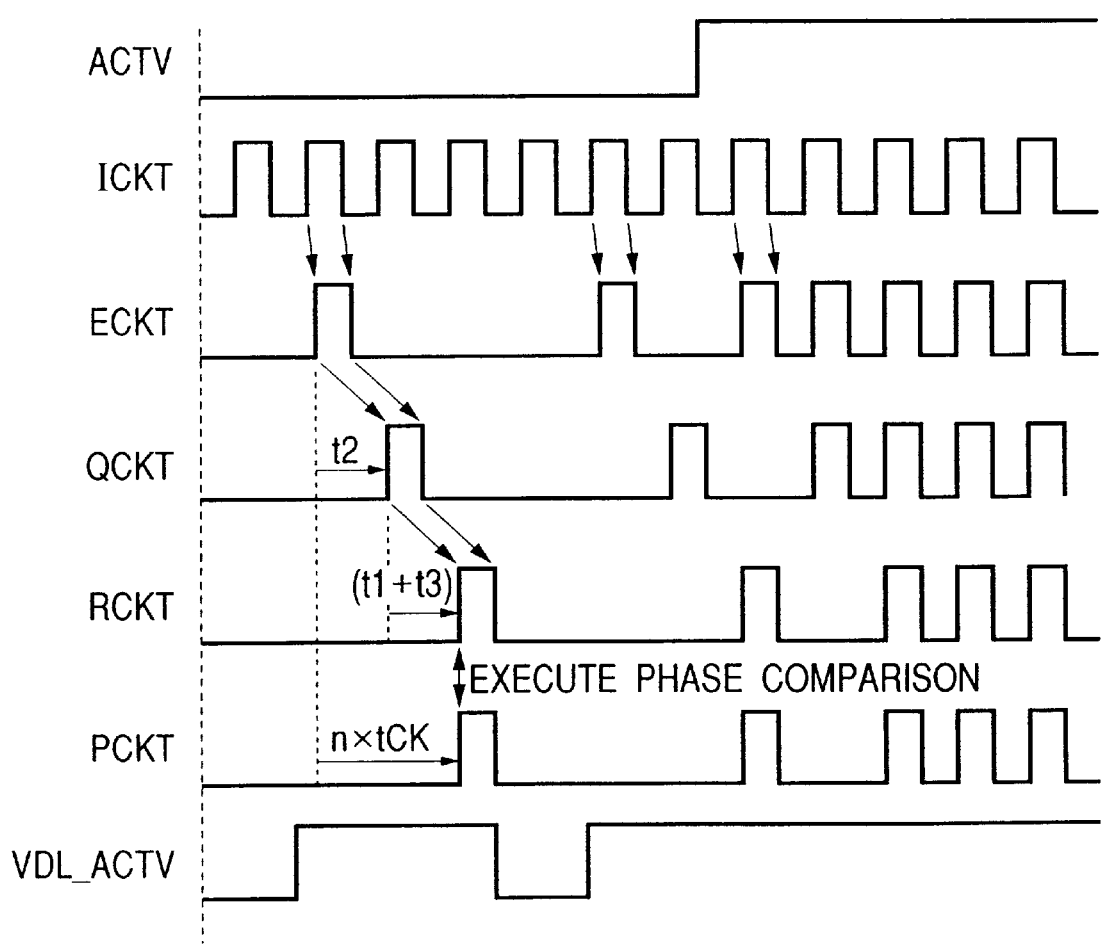
FIG. 16 is a timing chart showing changes in each individual signals at phase comparisons in the DLL circuit according to the second embodiment.

FIG. 16 shows changes in signals employed in the DLL circuit 100 shown in FIG. 15 when the DLL circuit starts its operation in a start sequence based on the input of a mode register set command MRS and a self-refresh end command SELFX, for example, etc. As shown in FIG. 16, each of pulses of a signal ECKT generated by the pulse generator 112 is made once (m=4 in FIG. 16) in an input clock ICKTm cycle, i.e., m×tCK. However, when a signal ACTV indicating that an active command ACTV has been inputted, is changed to a high level, the pulse generator 112 is configured so as to generate pulses sequentially after its change. Since the pulse generator 112 produces the signal ECKT from the input clock ICKT, the signal ECKT is identical in pulse width to the clock ICKT. Incidentally, the pulse generator 112 generates a signal ECKB opposite in phase to the signal ECKT while it is not shown in FIG. 16. Further, the pulse generator 112 is configured so as to generate a pulse PCKT similar to ECKT after the elapse of n×tCK (2tCK in FIG. 16) after the pulses of the signal ECKT have been produced.

The signals ECKT and ECKB generated by the pulse generator 112 are inputted to the variable delay circuit 101 from which they are outputted as a signal QCKT supplied with a delay of t2. The signal QCKT is inputted to the replica delay circuit 102 where it is supplied with a delay of (t1+t3), which in turn is outputted as a signal RCKT. The signal RCKT and the signal PCKT generated by the pulse generator 112 are inputted to the phase frequency detector 107 where they are phase-compared. When another rising edge of the signal RCKT is inputted between the first rising edge of the signal RCKT and the rising edge of the signal PCKT, the phase frequency detector 107 will produce a malfunction (harmonic lock).

In the present embodiment, however, the variable delay circuit 101 is controlled so as to gradually increase the delay time t2 from the state of the minimum delay time t2min under the condition that the signal ACTV is low in level. Therefore, if m>n, then another rising edge of the signal RCKT is not inputted between the first or initial rising edge of the signal RCKT and the first or initial rising edge of the signal PCKT. Thus, if the signal ACTV is low in level, there is then no possibility that the phase frequency detector will produce the malfunction. The phase frequency detector 107 produces such a signal VBUP or VBDN as to cause the first rising edge of the signal RCKT and the rising edge of the signal PCKT to coincide with each other. Consequently, the delay time of the variable delay circuit 101 is controlled to carry out the proper phase lock.

If the DLL circuit performs the phase lock in the above-described manner, then the phase difference between the signals RCKT and PCKT is extremely small. Therefore, even if the signal ACTV is thereafter changed to a high level and the pulse generator 112 produces pulses in the signal ECKT in succession, no malfunction (harmonic lock) is produced in the phase frequency detector 107. Further, since the input of the active command ACTV is prohibited during at least 200×tCK between the start of the operation of the DLL circuit and its phase lock according to the standard of the DDR SDRAM, no malfunction occurs even if the DLL circuit according to the present embodiment is used as the DLL circuit installed in the DDR SDRAM.

Further, the bias circuit 109 takes a configuration wherein a switch MOSFET Qs is connected in series with a MOSFET Qc having a gate terminal which receives a voltage VB supplied from the charge pump, as shown in FIG. 11(c). A signal VDL_ACTV for making the bias circuit 109 effective between the rising edge of the signal ECKT and the rising edge of the signal PCKT is supplied to the MOSFET Qs from the pulse generator 112, so that a bias voltage NBIAS supplied from the bias circuit 109 to the variable delay circuit 101 is turned on and off by the signal.

In the DLL circuit according to the present embodiment, the phase comparison is made once in the m cycles of the input clock ICKT. Since the phase lock is allowed if m>n, it is possible to increase the number of phase comparisons when n is large, as compared with the DLL circuit according to the embodiment shown in FIG. 1, in which the phase comparison can be made only once per 2×n times. Therefore, the DLL circuit according to the present embodiment has precedence over the DLL circuit according to the embodiment shown in FIG. 1.

Further, the DLL circuit according to the embodiment of FIG. 15 holds superiority over the above DLL circuit in that the signal is inputted to the variable delay circuit 101 only intermittently. In the DLL circuit according to the present embodiment, the signal VDL_ACTV is rendered low in level up to immediately before the next ECKT is generated after the completion of the generation of the signal PCKT, regardless of the values of all tCK, n and m as shown in FIG.

16, whereby the DLL circuit is controlled so that the bias voltage NBIAS is not applied from the bias circuit 109 to the variable delay circuit 101. Thus, the variable delay circuit 101 is deactivated and hence current consumption can be reduced.

The operation of the replica delay circuit 102 is also made once in m cycles and its operating current results in 1/m. While the operating current can be reduced to ½n owing to the provision of the divide-by-four circuit 105 immediately before the replica delay circuit 102 in the embodiment shown in FIG. 1, the present embodiment has an advantage in the execution of control on the rising edge because the falling edge is also delayed by the replica delay circuit 102.

Thus, since current consumption at standby (ACTV=0), of the entire DLL circuit is reduced, it is possible to reduce current consumption of the DDR SDRAM equipped with the DLL circuit according to the present embodiment.

Although the effect of reducing the current consumption of the DLL circuit is not provided, the phase comparison can be carried out once per m times even in the case where the divide-by-four circuits 104 and 105 are used as the pulse generating circuit or generator without being used as the dividing circuits or dividers in the embodiment shown in FIG. 1. Described specifically, if pulse signals of ECKT2 and RCKT2 are generated once in m cycles of clocks ECKT and RCKT inputted to the divide-by-four circuits 104 and 105, then a phase comparison can be done at a rate of once per m cycles. Even in this case, owing to the provision of the pulse generator in front of the replica delay circuit 102, current consumption of the replica delay circuit can be reduced and control on the falling edge can also be carried out.

While a description has been made of the applications to the DLL circuit, the present invention is not limited to the DLL circuit and is applicable even to clock generation circuits of various types such as SMD, NDC, BDD, PLL, etc.

Figure 17:
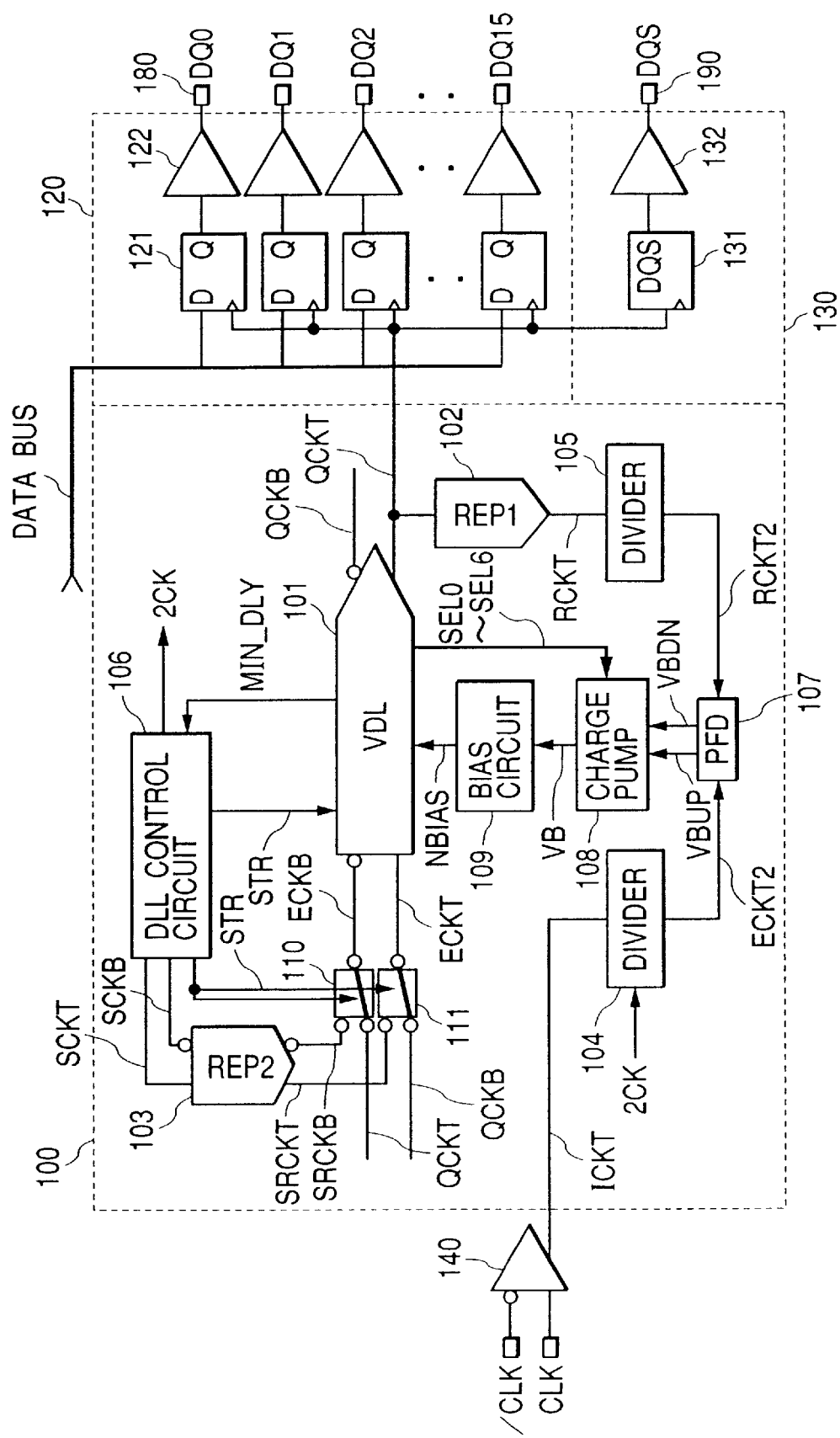
FIG. 17 is a block diagram illustrating an embodiment of a PLL circuit to which the present invention is applied.

FIG. 17 shows an embodiment in which the present invention is applied to a PLL (Phase Locked Loop) type clock generation circuit. The present embodiment has a configuration approximately similar to the DLL circuit shown in FIG. 1. The DLL circuit according to the present embodiment is different from the DLL circuit shown in FIG. 1 in that as the input to the variable delay circuit 101, its own differential output signal other than the external clocks CLK and /CLK is inverted in logic (positive and negative) and feedback inputted, thereby activating it as a ring oscillator. Incidentally, since the extra delay is not included in a feedback loop in the present embodiment, the amount of a delay of a variable delay circuit 101 becomes approximately equal to tCK. Therefore, the amount of a delay of a second replica delay circuit 102 may preferably be set to tm other than (t1+t3+tm).

Prior to the commencement of phase control even in the case of the PLL circuit according to the present embodiment, switch circuits 110 and 111 are selected to input clocks SRCKT and SRCKB generated by the second replica delay circuit 103 to the variable delay circuit 101, thereby determining the number of delay stages. Thereafter, the switch circuits 110 and 111 are changed over to invert and input clocks QCKT and QCKB outputted from the variable delay circuit 101. In doing so, a phase frequency detector 107 compares the phase of a clock RCKT2 obtained by delaying one output QCKT of the variable delay circuit 101 by a replica delay circuit 102 and dividing it by a divider 105 and the phase of a clock ECKT2 captured by an input buffer circuit 140 and obtained by dividing it by a divider 140, and outputs a signal VBUP or VBDN corresponding to a phase difference between the two phases, thereby controlling a delay time of the variable delay circuit 101, whereby clocks QCKT and QCKB having desired phases corresponding to the phases of the external clocks CLK and /CLK can be generated. Even in the present embodiment, switching can be performed between 1CK lock control and 2CK lock control according to the cycle of the external clock CLK, whereby a lock range can greatly be enlarged.

Figure 18:
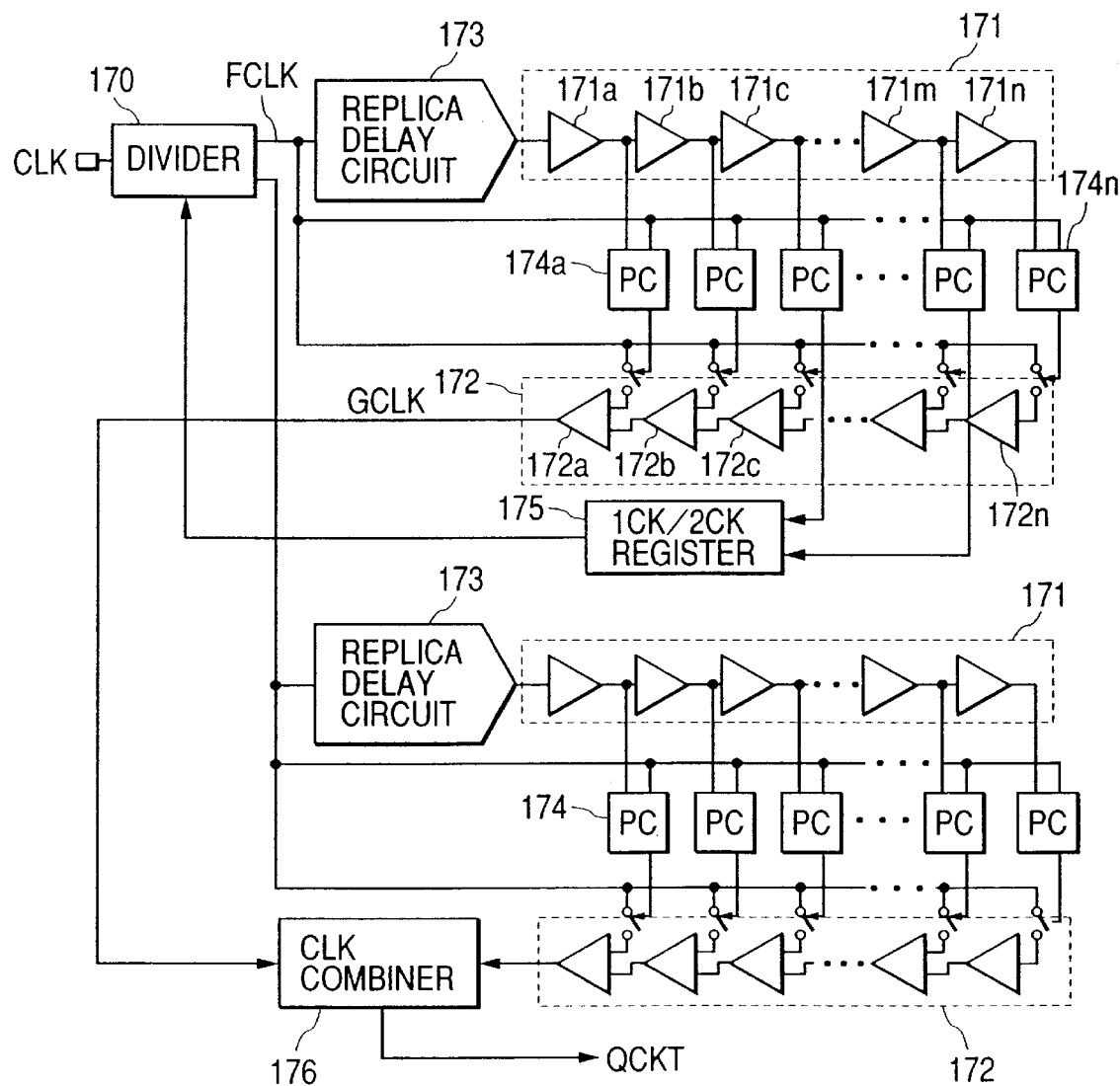
FIG. 18 is a block diagram showing an embodiment of an SMD circuit to which the present invention is applied.

FIG. 18 shows an embodiment in which the present invention is applied to an SMD (Synchronous Mirror Delay) type or an NDC (Negative Delay Circuit) type clock generation circuit. The SMD circuit according to the present embodiment has a forward delay sequence 171 and a backward delay sequence 172 each having the same number of delay stages. A replica delay circuit 173 for supplying a delay similar to the replica delay circuit employed in the above embodiment is provided in a stage preceding the forward delay sequence 171. Further, the SMD circuit is provided with phase comparators 174a through 174n for respectively comparing a clock FCLK anterior to being delayed by the replica delay circuit 173 and the phases of delayed clocks respectively outputted from delay stages 171a through 171n of the forward delay sequence 171. The clock FCLK prior to being delayed by the replica delay circuit 173 is inputted to delay stages of the backward delay sequence 172 corresponding to the delay stages having detected the coincidence between the phases thereat, and then transmitted in the backward direction, whereby a clock GCLK having the same delay as that at the forward delay sequence 171 is outputted. This is set as a basic configuration.

According to such a configuration, since the output clock of each delay stage in which the coincidence between the phases has been detected, is in phase with the clock FCLK prior to being delayed by the replica delay circuit 173, the clock GCLK outputted from the backward delay sequence 172 results in a clock obtained by giving the same delay as each delay detected by the forward delay sequence 171 to the clock FCLK prior to being delayed by the replica delay circuit 173, i.e., a clock having leaded the clock CLK by t3, i.e., having a minus phase. Thus, the output clock GCLK is set as the data latch clock QCKT of the output circuit 120 shown in FIG. 1 to thereby make it possible to output data DQ in phase with the external clock CLK (see FIG. 20A). Incidentally, while the first output appears after the elapse of two cycles even in the case of 1CK lock control as shown in FIG. 20A in the SMD circuit, the subsequent outputs can sequentially be produced in one cycle because the immediately preceding clock travels in the forward delay sequence and timing is determined thereby.

In the SMD circuit according to the present embodiment, a divider 170 is provided in a stage preceding the replica delay circuit 173 in the present embodiment. Therefore, a delay developed in the divider 170 is set so as to be included in a delay amount (t1+t3) of the replica delay circuit 173. Based on a signal outputted from a 1CK/2CK switching control circuit or register 175, the divider 170 is controlled so as to supply the external clock CLK to the replica delay circuit 173 as it is without its division upon 1CK lock control. On the other hand, when 2CK lock control is carried out, the divider 170 is controlled so as to supply a clock obtained by dividing-by-two the external clock CLK to the replica delay circuit 173. Thus, such control that a cycle tCK of the external clock and the delay of the SMD circuit become identical to each other, is performed upon the 1CK lock control, whereas upon the 2CK lock control, such control that two cycles 2tCK of the external clock and the delay of the SMD circuit become identical to each other, is performed. The output clock GCLK of the backward delay sequence 172 is outputted from a clock combiner 176 as a clock QCKT.

The SMD circuit according to the present embodiment is also provided with the 1CK/2CK switching control circuit 175 for detecting the number of the delay stages each of which produces a delay of 360° with respect to the phase of the present clock within the forward delay sequence 171, based on the outputs of the phase comparators 174a through 174n for respectively comparing the phases of the outputs of the respective delay stages of the forward delay sequence 171 and the phase of the clock FCLK prior to being delayed by the replica delay circuit 173 and performing switching between the 1CK lock control and the 2CK lock control. The 1CK/2CK switching control circuit 175 proceeds to the 2CK lock control if the detected number of states of the forward delay sequence 171 is smaller than a predetermined number upon the 1CK lock control, whereas if the detected number of stages of the forward delay sequence 171 is greater than the predetermined number upon 2CK lock control, then the 1CK/2CK switching control circuit 175 proceeds to the 1CK lock control. Thus, the switching between the 1CK lock control and the 2CK lock control is automatically performed by the 1CK/2CK switching control circuit 175.

Further, the SMD circuit according to the present embodiment is provided with another set of circuits similar to the replica delay circuit 173, forward delay sequence 171, phase comparators 174a through 174n and backward delay sequence 172. The circuits are supplied with a clock by-two divided by the divider 170 upon the 2CK clock control. However, the replica delay circuits 173 and the phase comparators 174 in the respective sets are controlled so as to be supplied with the clocks shifted in phase from each other by the cycle tCK of the input clock CLK upon the 2CK lock control. When the divided-by-two clock is supplied to the forward delay sequence 171, only a delay developed by the delay sequence falls short of one cycle and the phase comparators 174 might not be able to detect phase coincidence. However, the clock shifted in phase by the cycle tCK is supplied to the forward delay sequence 171 in the second set. It is thus possible to detect the corresponding delay stages coincident in phase to each other. A clock GCLK outputted from the backward delay sequence 172 in the set in which the coincidence of the phases has been detected, is outputted from the clock combiner 176 as a clock QCKT.

Although no particular limitation is imposed on switching timing, various embodiments are considered immediately after the start of operation of the SMD circuit, immediately after the start of operation of the DDR SDRAM, etc. where specific commands such as EMRS, etc. are inputted to the DDR SDRAM once per every time or a few times. Needless to say, no limitation is imposed on the switching between the 1CK lock control and the 2CK lock control even in the case of the present embodiment. Switching among 1CK lock control, 2CK lock control and 3CK lock control, switching among 1CK lock control, 2CK lock control and 4CK lock control, etc. may be carried out by increasing the division ratio of the divider 170.

Figure 19:
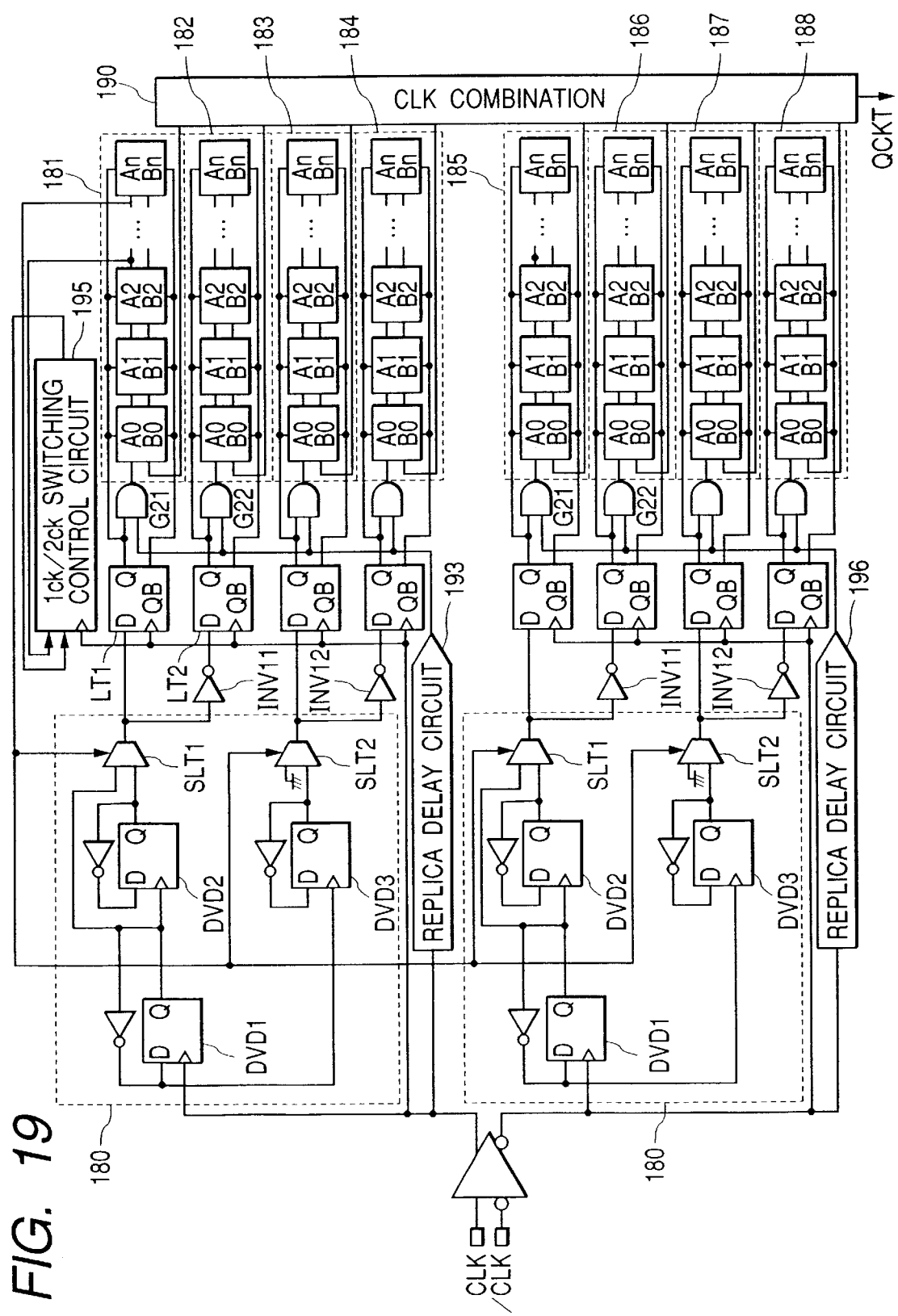
FIG. 19 is a block diagram illustrating an embodiment of a BDD circuit to which the present invention is applied.

FIG. 19 shows an embodiment in which the present invention is applied to a BDD (Bi-Directional Delay) type clock generation circuit. The BDD circuit according to the present embodiment is provided with bi-directional delay sequences 181 through 188 which have both operations of the forward delay sequences 171 and backward delay sequences 172 of the SMD circuit shown in FIG. 18 together. Of these, the bi-directional delay sequences 181 through 184 are circuits corresponding to an external clock CLK on the positive-phase side, whereas the bi-directional delay sequences 185 through 188 are circuits corresponding to an external clock /CLK on the negative-phase side. The bi-directional delay sequences 181 and 182 and the bi-directional delay sequences 185 and 186 respectively correspond to delay sequences for 1CK lock control, and the bi-directional delay sequences 183 and 184 and the bi-directional delay sequences 187 and 188 respectively correspond to delay sequences for 2CK lock control. Upon the 1CK lock control, the input of the clocks is cut off so that the bi-directional delay sequences 183, 184, 187 and 188 are deactivated. The configuration per se of each bi-directional delay sequence has heretofore been known. Since the known bi-directional delay sequences are used in the present embodiment, their detailed description will be omitted. On the other hand, the bi-directional delay sequences are substantially similar in SMD and principle of operation. As shown in FIG. 20B, a virtual return signal is produced due to the input of the clocks from the input buffer 140 when a signal proceeds up to a given delay stage from delay stages A0 to An through a replica delay circuit 193 during a clock one cycle tCK, whereby the signal turns back each bi-directional delay sequence to return to B0 and serves so as to be outputted to a clock combiner 190.

A divider circuit 180 comprises a divider DVD1 for dividing the external clock CLK, dividers DVD2 and DVD3 for respectively receiving the output of the DVD1 or its inverted output, a selector SLT1 for selecting either the output of the DVD1 or the output of the DVD2, and a selector SLT2 for selecting either the output of the DVD3 or a fixed potential (Vcc), and is configured so as to have the function of dividing-by-two and -four the external clock CLK. A 1CK/2CK switching control circuit 195 controls the selectors SLT1 and SLT2 so as to output a divided-by-two clock upon 1CK lock control and output a divided-by-four clock upon 2CK lock control. With the input of either the output of the DVD1 or its inverted output to the dividers DVD2 and DVD3, clocks outputted from the dividers DVD2 and DVD3 result in signals shifted in phase by 360° of the external clock, i.e., 1 cycle tCK. Further, the divider circuit 180 is provided with inverters INV11 and INV12 for respectively generating clocks 180° out of phase with the clocks selected by the selectors SLT1 and SLT2. Thus, the four clocks shifted in phase by 180°, 360° and 540° are produced.

According to the 1CK/2CK switching control circuit 195, a clock obtained by dividing-by-two the external clock CLK and a clock 180° out of phase with it are inputted to the bi-directional delay sequences 181 and 182 to generate clocks each having a desired delay upon the 1CK lock control. According to the 1CK/2CK switching control circuit 195, when the 2CK lock control is made, a clock obtained by dividing-by-four the external clock CLK and a clock 180° out of phase with it are inputted to the bi-directional delay sequence 181 through a latch LT1 and an AND gate G21, and a clock shifted in phase by 1 cycle tCK with respect to the clock CLK inputted to the bi-directional delay sequence 181 and a clock 180° out of phase with it are inputted to the bi-directional delay sequence 182 through a latch LT2 and an AND gate G22. Further, a clock obtained by delaying the external clock by (t1+t3) with the replica delay circuit 193 is inputted to other input terminals of the AND gates G21 and G22.

The bi-directional delay sequences 185 through 188 are also different from the above bi-directional delay sequences 181 through 184 only in that the external clock /CLK is inputted, and are similar to thereto in operation. Owing to the provision of the bi-directional delay sequences 185 through 188, the rise of an output clock QCKT can be controlled or restricted by the bi-directional delay sequences 181 through 184, whereas the fall thereof can be controlled by the bi-directional delay sequences 185 through 188. Even in the present embodiment, the 1CK/2CK switching control circuit 195 detects the cycle of the clock, based on the signals outputted from the delay stages AO through An of the bi-directional delay sequence 181, thereby making it possible to automatically perform switching between the 1CK lock control and the 2CK lock control.

Figure 22:
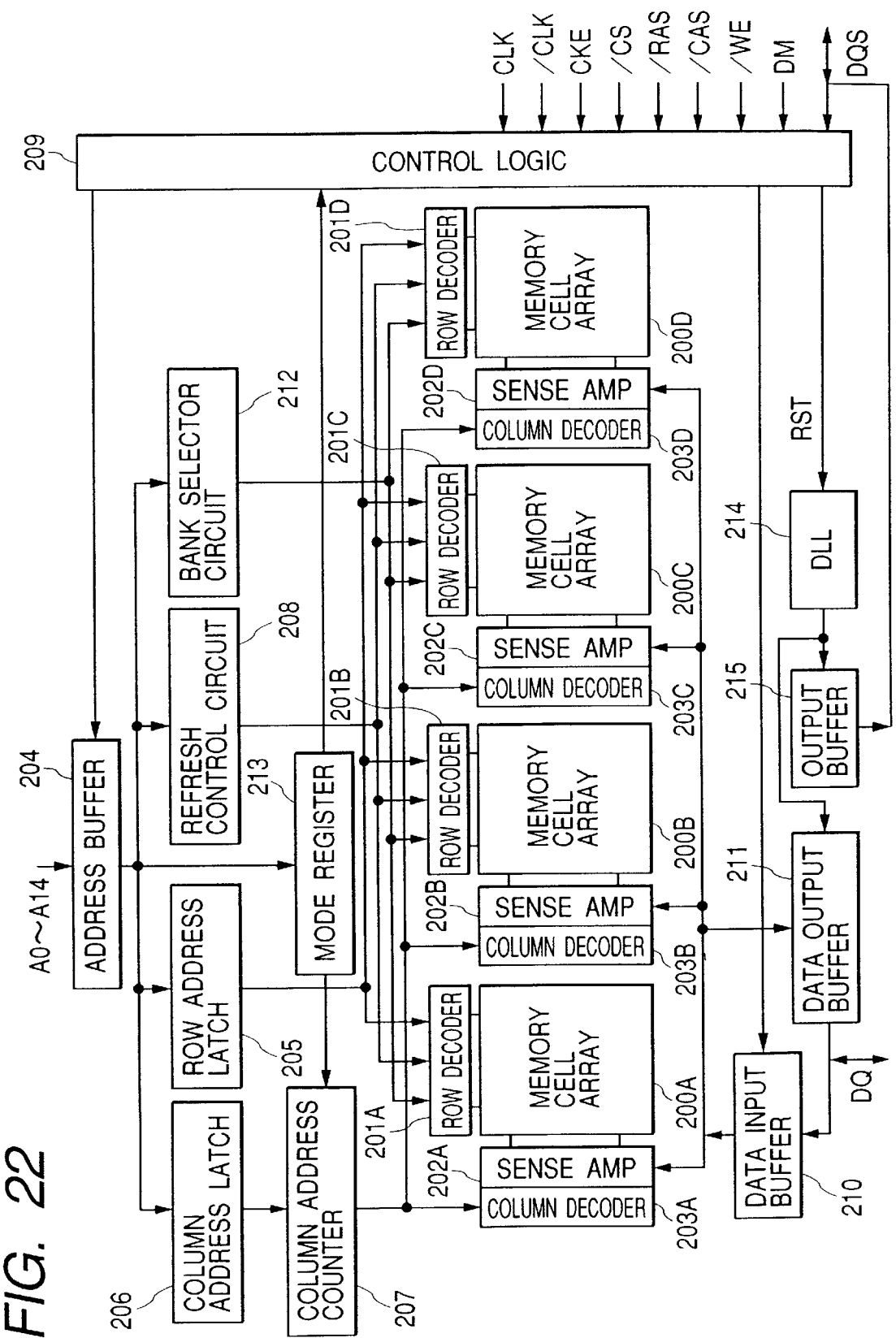
FIG. 22 is a block diagram showing an embodiment of a DDR SDRAM using a DLL circuit to which the present invention is applied.

FIG. 22 is a block diagram of the DDR SDRAM equipped with the DLL circuit to which the present invention is applied.

The SDRAM shown in FIG. 22 comprises memory cell arrays 200A through 200D comprised of, for example, four banks in which a plurality of memory cells are disposed in matrix form and having a storage capacity of 256 Mbits or so in total, an address buffer 204 which takes in addresses A0 through A14 inputted from outside, a row address latch 205 which latches the row address of the addresses captured by the address buffer 204, a bank selector circuit 212 which decodes the bank address of the addresses captured by the address buffer 204 to thereby select any of the memory cell arrays 200A through 200D, a column address latch 206 which latches the column address thereof, row address decoders 201A through 201D each of which decodes the row address to thereby select a word line within each of the memory cell arrays 200A through 200D, sense amplifier circuits 203A through 203D each of which amplifies a signal read into a bit line according to the selection of the word line, a column address counter 207 which automatically updates the column address latched in the column address latch 206 thereinside, column address decoders 203A through 203D each of which decodes the column address to thereby select a column (bit line) lying within each of the memory cell arrays 200A through 200D, a control logic 209 which generates internal control signals in response to control signals such as a chip select signal /CS, etc. inputted from outside, a data output buffer 211 which outputs data read from the memory cell arrays 200A through 200D to the outside, an output buffer 215 which provides a data strobe signal DQS indicative of timing for each data outputted from the output buffer 211, a clock generation circuit 214 comprising the DLL according to the present invention, which controls the timing for each data outputted from the output buffer 211, an input buffer 210 which receives data inputted from the outside, a refresh control circuit 208 which refreshes each of the memory cell arrays 200A through 200D, based on the corresponding control signal inputted from the outside, a mode register 213 which sets an operation mode, based on part of the address signals inputted from outside, etc.

As the control signals inputted to the control logic 209 from outside, may be mentioned, a pair of clocks CLK and /CLK opposite in phase to each other, a clock enable signal CKE indicating that the clocks are effective or valid, a row address strobe signal /RAS (hereinafter called "RAS signal"), a column address strobe signal /CAS (hereinafter called "CAS signal"), a write enable signal /WE for providing instructions for a data write operation, a data strobe signal DQS indicative of timing provided to input and/or output data, a data mask signal DM for inhibiting the input/output of the data, etc. in addition to the chip select signal /CS for bringing a chip to a selected state. Of these signals, those marked with "/" in front of the symbols each meaning that a low level is an effective level. The control logic 209 causes an internal register to hold the value of CAS latency, etc. according to an MRS command for providing instructions for setting to the mode register, of input commands.

In the DDR SDRAM according to the embodiment, the external clocks CLK and /CLK are rendered effective for the control logic 209 when the clock enable signal CKE is high in level. Since an internal clock outputted from the DLL is necessary upon a read (READ) operation of the DDR SDRAM, a description will be made here of the read operation of the DDR SDRAM.

In a DRAM (Dynamic Random Access Memory) having adopted address multiplex as well as the DDR SDRAM, a row address is captured according to the input of an active command ACTV to thereby bring each of the memory cell arrays 200A through 200D to an active state. Thereafter, when a read command READ is inputted, a column address is captured to select a column.

The DDR SDRAM is divided into the four memory cell arrays 200A through 200D to enhance the efficiency of the input/output of data. When an active command ACTV comprised of a combination of signals that CKE=1, /CS=0, /RAS=0, /CAS=1, and /WE=1 is inputted at a cross-point of CLK and /CLK on the rising side of CLK in order to activate the memory cell arrays 200A through 200D, the input address signals A0 through A14 are divided into bank address signals and row address signals, which in turn are respectively brought to the bank selector circuit 212 and the row address latch 206. When a bank corresponding to the bank address signal and a word line corresponding to the row address signal are selected, data stored in a memory cell connected to the selected word line is read into its corresponding bit line and amplified and held by each of the sense amplifier circuits 202A through 202D.

Thereafter, a column address is specified to read the intended data from each of the sense amplifier circuits 202A through 202D. When a read command READ comprised of a combination of signals that CKE=1, /CS=0, /RAS=1, /CAS=0 and /WE=1 is inputted at the cross-point of CLK and /CLK on the rising side of CLK, the input address signals AO through A14 are divided into bank address signals and column address signals, which are respectively brought to the bank selector circuit 212 an the column address latch 206. Since /WE=1 is designated, the control logic 209 recognizes it as the read operation. If a bank specified by the corresponding bank address signal is active, then the read operation is started. Further, data for a column selected by each of column address decoders 203A through 203D is read into the data output buffer 211 and latched with timing for an internal clock outputted from the DLL 214. Since the internal clock outputted from the DLL 214 has a phase which leads the clocks CLK and /CLK by a delay developed in the data output buffer 211, output data DQ is kept in phase with the external clocks CLK and /CLK.

In the DDR SDRAM, various operating conditions such as the number of cycles in which the read command READ can be issued since the issue of the active command ACTV, the number of cycles from the issue of the read command READ to the output of data, on/off of the DLL, etc. are held in the internal register 213. A command for rewriting the value of the internal register 213 exists. Two types of internal registers exit in the DDR SDRAM roughly in parts. The contents thereof are rewritten by an MRS (Mode Register Set) command and an EMRS (Extended Mode Register Set) command. At the cross-point of CLK and /CLK on the rising side of CLK, a combination of signals that CKE=1, /CS=0, /RAS=0, /CAS=0 and /WE=0 is inputted. When the value of the address signal A14 at this time is "0", for example, the MRS command is given, whereas when A14 is "1", the EMRS command is given. The contents of each register is suitably rewritten according to the input of each address other than A14.

Figure 21:
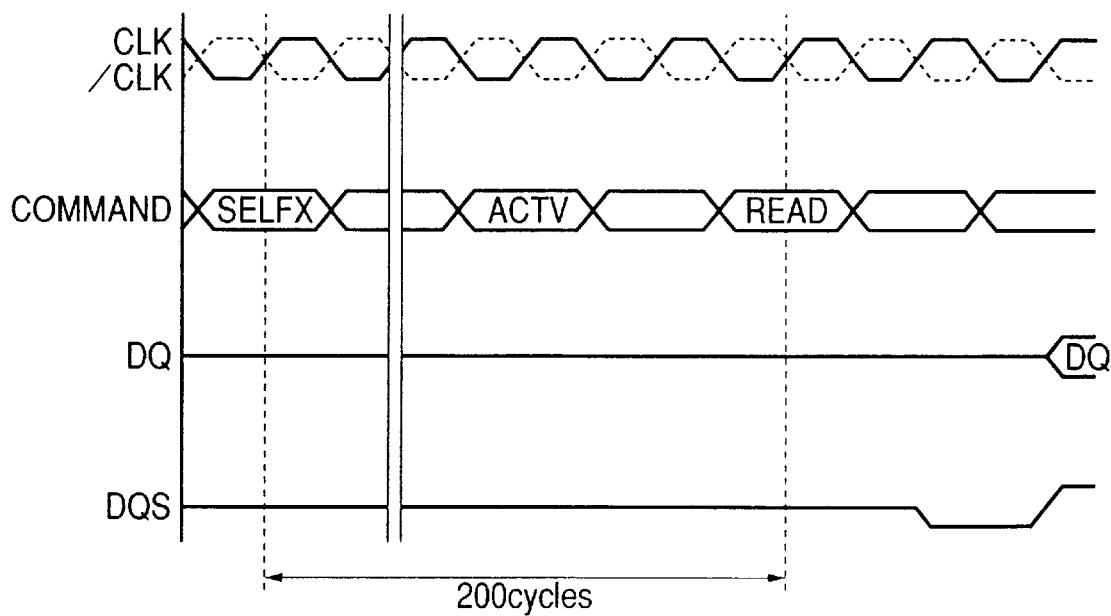
FIG. 21 is a timing chart for describing the number of cycles from the input of a SLFX command to the introduction of a READ command both employed in an SDRAM.

The DLL 214 starts its operation according to the input of the mode register set command MRS or self-refresh end command SELFX immediately after power-on or when it is released from a self-refresh state. According to the standard of the DDR SDRAM at this time, the READ command is prohibited from being inputted during 200 cycles at lowest since the input of the mode register set command MRS or self-refresh end command SELFX as shown in FIG. 21. Thus, a phase lock operation of the DLL may be completed during the 200 cycles. The DLL according to the embodiment is capable of performing such phase lock. When the mode register set command MRS or the self-refresh end command SELFX is inputted, the SDRAM equipped with the DLL according to the embodiment performs phase lock corresponding to the cycle even if the cycle of each clock is changed. Thus, a system having a low power consumption mode, which is slow in clock frequency, can reduce even power consumption of the SDRAM equipped with the DLL according to the present embodiment.

While the invention made above by the present inventors has been described specifically based on the embodiments, the invention of the present application is not limited to the embodiments. It is needless to say that various changes can be made thereto within the scope not departing from the substance thereof. While the present embodiment has been described which is capable of performing both of switching to the number of stages for a variable delay circuit and switching to nCK lock control, the present embodiment may be configured so as to be capable of performing only the switching to the nCK lock control without the switching to the number of stages. In this case, the output of the variable delay circuit and the STR signal can be compared so as to perform switching between the 1CK lock control and the 2CK lock control. While the DLL control circuit is configured so as to control the number of clock cycles for a delay amount from the input of a variable delay circuit to the output of a fixed delay circuit, based on a signal outputted from the variable delay circuit in the present embodiment, the DLL control circuit is provided with setting means such as a register or the like and may be configured so as to control the number of clock cycles, based on set information stored in the register.

The phase of the ECKT2 has been changed between 1CK lock and 2CK lock in order to prevent harmonic lock. However, even when the phase of the RCKT2 is changed or both the ECKT2 and RCKT2 are changed in phase, a similar effect can be obtained.

Advantageous effects obtained by typical ones of the inventions disclosed in the present application will be described in brief as follows:

According to the present invention, the number of stages for a variable delay circuit is changed over and switching is performed between 1CK lock control and 2CK lock control in a DLL circuit which constitutes a clock generation circuit built in an SDRAM or the like. It is thus possible to implement DLL having a wide lock range. Since delay stages subsequent to predetermined delay stages in the variable delay circuit of the DLL circuit can be deactivated, the DLL circuit can be reduced in current consumption. According to the present invention as well, switching is performed between 1CK lock control and 2CK lock control, based on a start sequence specified by an MRS or the like even in the case of an SMD circuit and a BDD circuit, whereby DLL having a wide lock range can be implemented.

We claim:

1. A clock reproducing circuit comprising:
   a phase comparison circuit to perform phase comparison of input signals based on a first number of clock cycles or based on a second number of clock cycles; and
   a circuit to control said phase comparison circuit according to a start sequence to select phase comparison of said in put signals based on one of the first number of clock cycles and the second number of clock cycles.

2. The clock reproducing circuit according to claim 1, wherein said start sequence is specified by a mode register set command.

3. The clock reproducing circuit according to claim 1 or 2, which is included in a DDR SDRAM.

4. The clock reproducing circuit according to any of claims 1 to 3, including one of a DLL circuit, an SMD circuit and an NDC or a BDD circuit.

5. The clock reproducing circuit according to claim 1, including either one of a delay locked loop circuit, a synchronous mirror delay circuit, a negative delay circuit, and a bi-directional delay circuit.

6. A clock generation circuit comprising:
   a phase comparison circuit to perform phase comparison of input signals based on a first number of clock cycles or based on a second number of clock cycles; and
   a circuit to control said phase comparison circuit according to a command to select phase comparison of said input signals based on one of the first number of clock cycles and the second number of clock cycles.

7. The clock generation circuit according to claim 6, wherein said command is a mode register set command.

8. The clock generation circuit according to claim 6, including either one of a delay locked loop circuit, a synchronous mirror delay circuit, a negative delay circuit, and a bi-directional delay circuit.

9. The clock generation circuit according to claim 6, including a delay locked loop circuit.

10. The clock generation circuit according to claim 6, wherein the first number of clock cycles is 1 and the second number of clock cycles is 2.

11. A clock generation circuit comprising:
    a circuit to input a first clock signal and output a second lock signal obtained by delaying the first clock signal;
    a phase comparison circuit to perform phase comparison between the first clock signal and the second clock signal based on a first number of clock cycles or to perform phase comparison between the first clock signal and the second clock signal based on a second number of clock cycles; and
    a circuit to control said phase comparison circuit according to a command to select phase comparison of said first clock signal and said second clock signal based on one of said first number of clock cycles and said second number of clock cycles.

12. The clock generation circuit according to claim 11, wherein said command is a mode register set command.

13. The clock generation circuit according to claim 11, including a delay locked loop circuit.

14. The clock generation circuit according to claim 11, wherein the first number of clock cycles is 1, and the second number of clock cycles is 2.

15. A DDR type dynamic random access memory comprising:

a clock reproducing circuit which inputs a first clock signal and outputs a second clock signal obtained by delaying the first clock signal, a phase comparison circuit to perform phase comparison between the first clock signal and the second clock signal based on a first number of clock cycles or to perform phase comparison between the first clock signal and the second clock signal based on a second number of clock cycles; and a circuit to control said phase comparison circuit according to a command to select phase comparison of said first clock signal and said second clock signal based on one of said first number of clock cycles and said second number of clock cycles.

16. The dynamic random access memory according to claim 15, wherein said command is a mode register set command.

17. The dynamic random access memory according to claim 15, including a delay locked loop circuit.

18. The dynamic random access memory according to claim 15, wherein said first clock cycle is 1 and said second clock cycle is 2.

* * * * *